(12) United States Patent
Betzner

(10) Patent No.: US 9,465,078 B2
(45) Date of Patent: Oct. 11, 2016

(54) BATTERY CAPACITY AND DURABILITY PREDICTION METHOD

(71) Applicant: Fairfield Industries, Inc., Sugarland, TX (US)

(72) Inventor: Timothy M. Betzner, Sugar Land, TX (US)

(73) Assignee: FAIRFIELD INDUSTRIES, INC., Sugarland, TX (US)

( * ) Notice: Subject to any disclaimer, the term of this patent is extended or adjusted under 35 U.S.C. 154(b) by 805 days.

(21) Appl. No.: 13/790,284

(22) Filed: Mar. 8, 2013

(65) Prior Publication Data

US 2014/0129163 A1 May 8, 2014

Related U.S. Application Data

(60) Provisional application No. 61/721,962, filed on Nov. 2, 2012.

(51) Int. Cl.
*G01R 31/36* (2006.01)
*H01M 10/48* (2006.01)

(52) U.S. Cl.
CPC ....... *G01R 31/3606* (2013.01); *G01R 31/3651* (2013.01); *H01M 10/486* (2013.01)

(58) Field of Classification Search
CPC ......... G01R 31/3651; G01R 31/3606; H01M 10/486
See application file for complete search history.

(56) References Cited

U.S. PATENT DOCUMENTS

| | | |
|---|---|---|
| 4,905,404 A | 3/1990 | Pasion et al. |
| 5,253,223 A | 10/1993 | Svenning et al. |
| 5,271,953 A | 12/1993 | Litteral |
| 5,442,590 A | 8/1995 | Svenning et al. |
| 5,811,055 A | 9/1998 | Geiger |
| 6,350,085 B1 | 2/2002 | Bath et al. |
| 6,456,565 B1 | 9/2002 | Grall et al. |
| 6,474,254 B1 | 11/2002 | Ambs et al. |
| 6,588,980 B2 | 7/2003 | Worman et al. |
| 6,612,397 B2 | 9/2003 | Sparrevik et al. |
| 6,625,083 B2 | 9/2003 | Vandenbroucke |
| 6,657,921 B1 | 12/2003 | Ambs |

(Continued)

FOREIGN PATENT DOCUMENTS

| | | |
|---|---|---|
| WO | WO-01/73477 A2 | 10/2001 |
| WO | WO-02/46793 A1 | 6/2002 |

OTHER PUBLICATIONS

Final Office Action for U.S. Appl. No. 12/343,136, dated Apr. 25, 2011.

(Continued)

*Primary Examiner* — Regis Betsch
(74) *Attorney, Agent, or Firm* — Foley & Lardner LLP; James De Vellis

(57) ABSTRACT

A method of determining battery performance information indicative of a performance of a battery in a device is disclosed, the method including: receiving environmental condition information indicative of environmental conditions of the device during a usage period; receiving operating parameter information indicative of one or more operating parameters of the battery during the usage period; and determining the battery performance information based at least in part on: the environmental condition information, the operating parameter information, and a performance model corresponding to the battery.

49 Claims, 12 Drawing Sheets

(56) References Cited

U.S. PATENT DOCUMENTS

| | | |
|---|---|---|
| 6,975,560 B2 | 12/2005 | Berg et al. |
| 6,992,951 B2 | 1/2006 | O'Brien et al. |
| 7,210,556 B2 | 5/2007 | Bath et al. |
| 7,254,093 B2 | 8/2007 | Ray et al. |
| 7,632,043 B2 | 12/2009 | Thompson et al. |
| 8,127,706 B2 | 3/2012 | Thompson et al. |
| 8,310,899 B2 | 11/2012 | Woodard et al. |
| 8,534,959 B2 | 9/2013 | Thompson et al. |
| 8,579,545 B2 | 11/2013 | Jewell et al. |
| 8,611,181 B2 | 12/2013 | Woodward et al. |
| 2001/0028041 A1 | 10/2001 | Hubbard |
| 2002/0172562 A1 | 11/2002 | Worman et al. |
| 2003/0218937 A1 | 11/2003 | Berg et al. |
| 2005/0052951 A1 | 3/2005 | Ray et al. |
| 2005/0155814 A1 | 7/2005 | Bath et al. |
| 2005/0276665 A1 | 12/2005 | Entralgo et al. |
| 2006/0120216 A1 | 6/2006 | Ray et al. |
| 2006/0159524 A1 | 7/2006 | Thompson et al. |
| 2006/0243189 A1 | 11/2006 | Thompson et al. |
| 2006/0286931 A1 | 12/2006 | Rhodes et al. |
| 2007/0070808 A1 | 3/2007 | Ray et al. |
| 2007/0248417 A1 | 10/2007 | Berg |
| 2007/0258774 A1 | 11/2007 | Thompson et al. |
| 2008/0041296 A1 | 2/2008 | Thompson et al. |
| 2008/0049554 A1* | 2/2008 | Crice ............... G01V 1/223 367/79 |
| 2008/0144442 A1 | 6/2008 | Combee et al. |
| 2008/0279636 A1 | 11/2008 | Ray et al. |
| 2009/0037145 A1* | 2/2009 | Suzuki ........... G01R 31/3679 702/183 |
| 2009/0052992 A1 | 2/2009 | Thompson et al. |
| 2011/0158040 A1* | 6/2011 | Kooper ............... G01V 1/223 367/13 |
| 2013/0204456 A1* | 8/2013 | Tippelhofer ....... B60L 11/1809 701/1 |

OTHER PUBLICATIONS

International Preliminary Report on Patentability and Written Opinion of the International Searching Authority for Application No. PCT/US2009/069037, dated Jun. 29, 2011.

International Search Report and Written Opinion of the International Searching Authority mailed Nov. 19, 2008 for PCT/US2008/072469.

International Search Report Application No. PCT/US2009/069037, dated Aug. 5, 2010.

Non-Final Office Action for U.S. Appl. No. 12/343,136, dated Nov. 22, 2010.

US Office Action on U.S. Appl. No. 14/106,489 DTD Apr. 3, 2015.

Non-Final Office Action dated Jun. 3, 2013 in U.S. Appl. No. 13/671,645 (9 pages).

Non-Final Office Action in U.S. Appl. No. 14/106,489 dtd Dec. 23, 2014 (13 pages).

Notice of Allowance dated Oct. 30, 2013 in U.S. Appl. No. 13/671,645 (7 pages).

Non-Final Office Action on U.S. Appl. No. 14/106,489 mailed Jul. 10, 2015.

US Office Action on U.S. Appl. No. 14/106,489 dated Oct. 23, 2015.

US Office Action on U.S. Appl. No. 14/106,478 dated Mar. 7, 2016.

US Office Action on U.S. Appl. No. 14/106,489 dated Feb. 16, 2016.

* cited by examiner

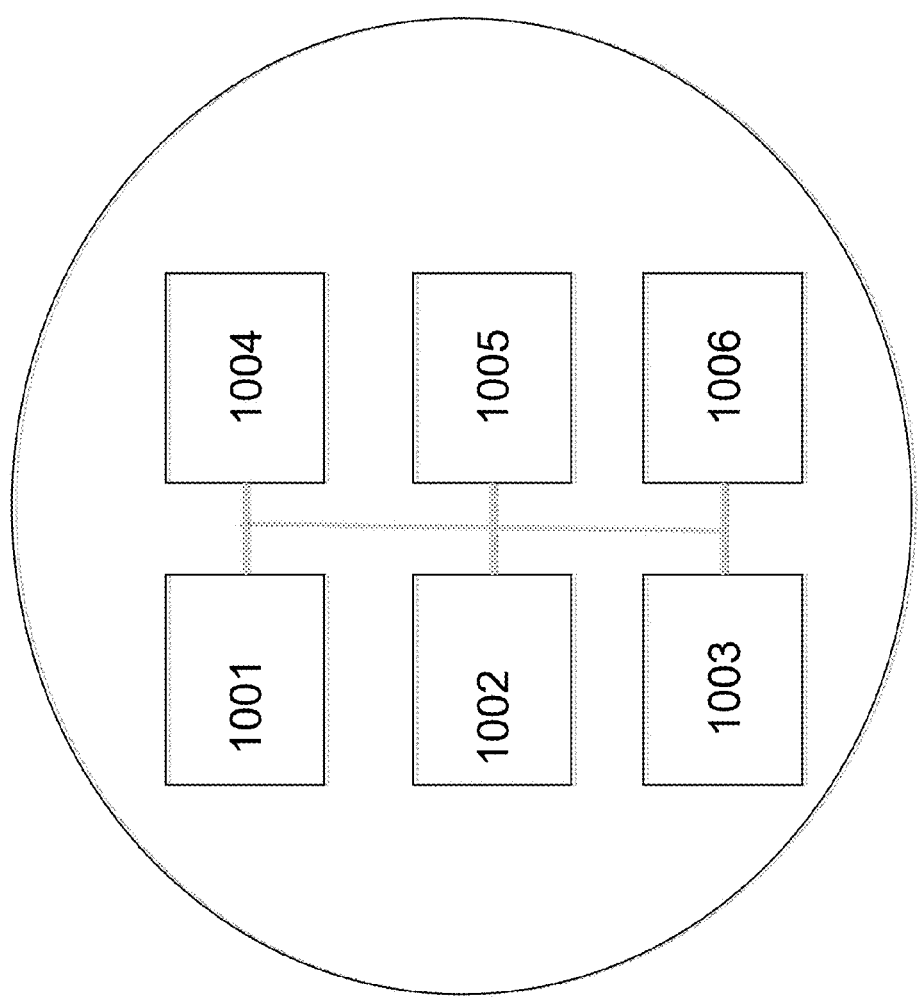

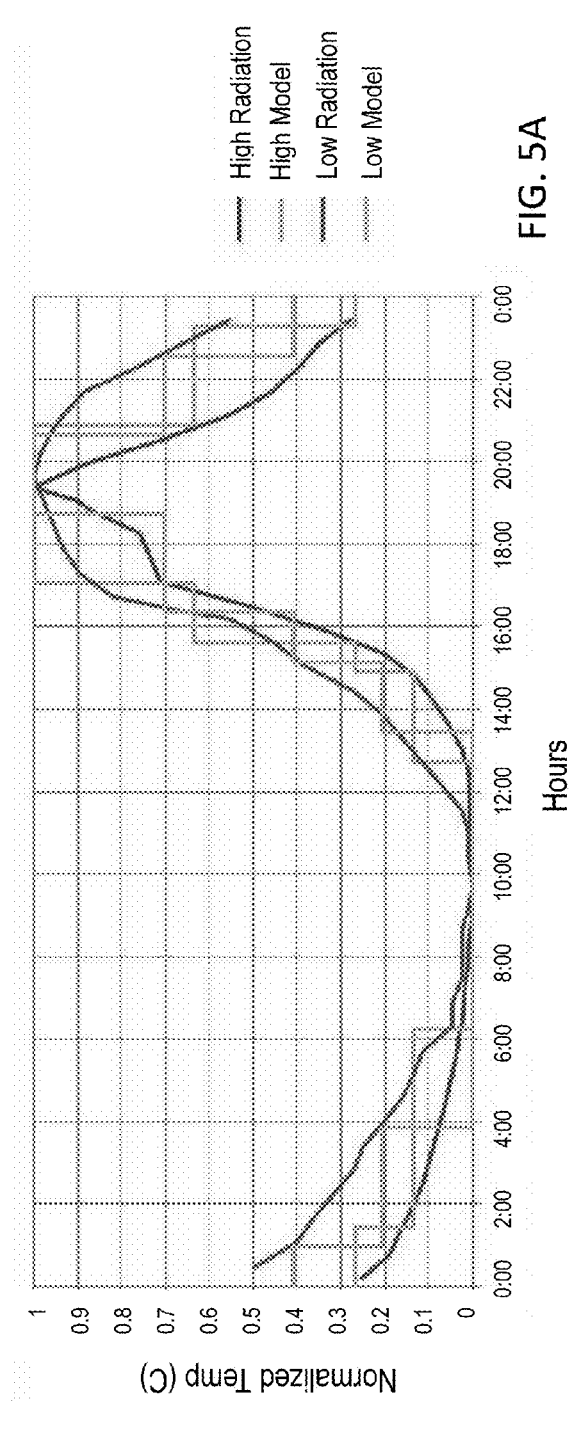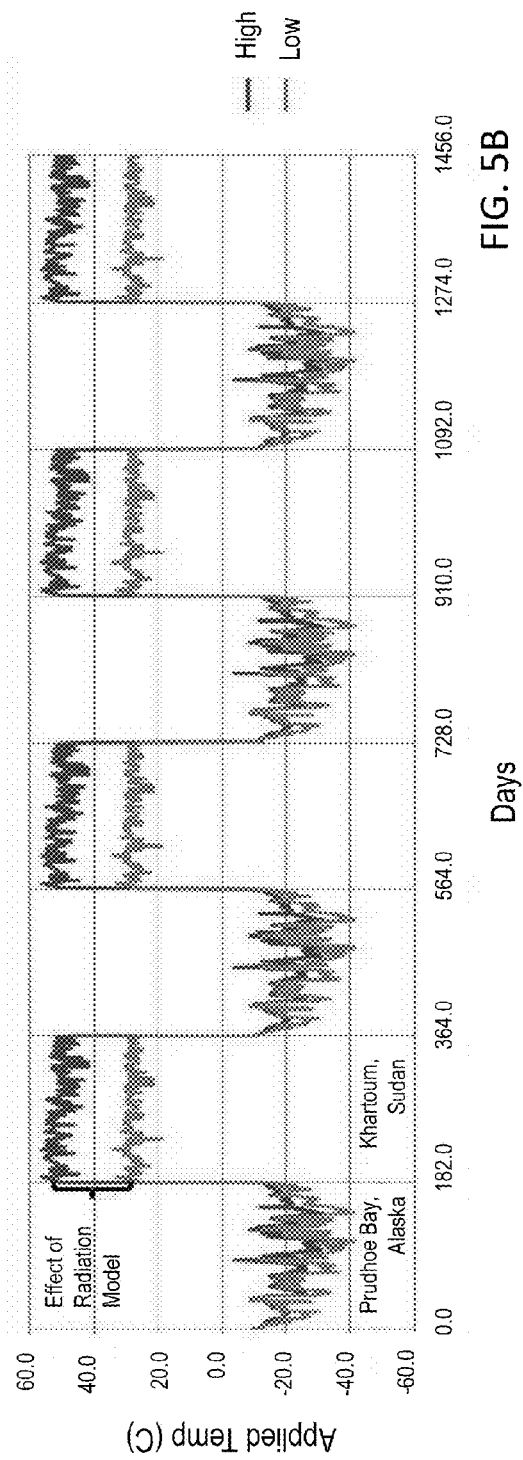
FIG. 5A
FIG. 5B

US 9,465,078 B2

BATTERY CAPACITY AND DURABILITY PREDICTION METHOD

CROSS-REFERENCE TO RELATED APPLICATION

This application claims the benefit of U.S. Provisional Application No. 61/721,962, filed Nov. 2, 2012, which is incorporated by reference herein in its entirety.

BACKGROUND

The following section is presented for informational purposes only. The inclusion of material in this section should not be considered to be an admission that such material is prior art to the present application.

Electronic devices are used in a wide range of conditions including desert and arctic environments. In many cases, the energy storage device utilized in these electronic devices are rechargeable batteries formed of one or more cells. Because of the chemical reactions within the cells, the capacity of a battery depends on the discharge conditions such as the magnitude of the current (which may vary with time), the allowable terminal voltage of the battery, and environmental conditions, such as temperature.

In particular, the permanent capacity of rechargeable batteries typically used as a power source may vary widely with temperature, from 100% at moderate temperatures to possibly 0% at temperature extremes, especially cold temperatures. In addition to environmental conditions, the permanent capacity of batteries may decay over their operational life with aging or charge/discharge cycling. This decay may be accelerated even more by the environmental conditions. Further, the acceleration of decay may itself be a function of deployment temperature, such that batteries aged under a set of environmental conditions may experience different capacity decay if subsequent usage is at moderate temperatures versus usage at extreme temperatures. Alterations in operational temperatures that result in capacity decay are referred to as thermal cycling decay. Thermal cycling decay is particularly prevalent when batteries are subjected to extreme cold temperatures common in the field of seismic exploration, which are often below −20° C. and may be as low as, if not below, −40° C.

Various techniques may be used for battery testing including battery burn-in testing during manufacturing, model simulation of capacity in extreme conditions, testing during charging at out-of-spec temperatures, testing for capacity remaining in down-hole oil field applications, and estimating capacity with temperature correction. Battery testing is routine during the product development cycle in mobile phone, laptop, and automotive fields. However, these techniques primarily focus on testing batteries within certain predetermined parameters or designed operational specifications, such as the cell discharge rate for which the battery is designed.

While the need for improved method of battery performance prediction may extend to many fields including automotive, aerospace, medical, consumer electronics, and anywhere a battery is used in remote or inaccessible locations such as satellites, remotely operated vehicles or snow machines, one field in particular where accurate performance predication is critical is the field of seismic exploration. In the extreme temperature environments common in seismic exploration, seismic data acquisition devices such as seismic recording units (RUs) may suffer unacceptable battery life in a given deployment, aging over time and multiple cycles, and combined effects, as well as potential mechanical stresses and irreversible chemical reactions that could cause a battery to fail to function safely or at all. Characterization of these effects is essential to predict the duration of batteries used, especially for planning purposes. This is particularly true since RUs utilized in these extreme conditions are typically sealed, with electronics, sensors and batteries built into the products. As such, batteries for these devices are not readily replaced, and the need to accurately predict performance is heightened. In any event, features of the corresponding RU's usage regime complicate testing of seismic batteries. For instance, the performance of an RU's battery may be impacted by the extremely low discharge rates common in RU devices. As a non-limiting example, these rates may be as low as a few mA or lower. On the one hand, the low rate allows usage scenarios unforeseen by mobile phone, laptop, and automotive battery pack makers, as well as the cell makers themselves. On the other hand, the low rate significantly extends the testing duration before useful results can be obtained.

There is a need for improved method of battery performance prediction and evaluation, particularly for battery performance prediction and evaluation outside standard operating parameters. Such prediction and evaluation should address a variety of usage regimes of batteries across a range of temperature, charge/discharge cycling, and discharge rates, especially for regimes of operation significantly beyond the original specification of the battery.

SUMMARY

The applicants have developed devices, systems, and methods as described herein that may be used to characterize battery performance, taking into account the battery environmental conditions an operating parameters.

In one aspect, a method of determining battery performance information indicative of a performance of a battery in a device is disclosed, the method including: receiving environmental condition information indicative of environmental conditions of the device during a usage period; receiving operating parameter information indicative of one or more operating parameters of the battery during the usage period; and determining the battery performance information based at least in part on: the environmental condition information, the operating parameter information, and a performance model corresponding to the battery.

Some embodiments include receiving location information indicative of a spatial and temporal location of the battery during the usage period; and generating the environmental condition information based at least in part on the location information and an environmental model indicative of the environmental conditions at the location during the usage period.

In some embodiments, the environmental model includes a weather model. In some embodiments, the weather model provides information indicative of the daily temperature at the location during the usage period.

Some embodiments include acquiring at least a portion of the location information using a global positioning unit. Some embodiments include acquiring at least a portion of the location information using a clock included in the device.

Some embodiments include determining at least a portion of the environmental condition information using at least one sensor. In some embodiments, the sensor is included in the device. In some embodiments, the sensor includes a temperature sensor. In some embodiments, determining at least a portion of the environmental condition information using a sensor includes determining information indicative of the temperature of the battery during the usage period.

Some embodiments include determining at least a portion of the environmental condition by accessing a data source located remotely from the device. In some embodiments, the data source includes a weather data source.

Some embodiments include controlling the operation of the device based at least in part on the battery performance information. In some embodiments, controlling the operation of the device based at least in part on the battery performance information includes controlling at least one operating parameter of the battery.

Some embodiments include outputting the battery performance information.

In some embodiments, the device includes a seismic data acquisition unit. In some embodiments, the seismic data acquisition unit includes: at least one seismic vibration sensor, a clock, a memory configured to store data from the sensor; the battery; and battery control electronics. Some embodiments include programming or otherwise controlling the battery control electronics based at least in part on the battery performance information. In some embodiments, the seismic data acquisition unit includes a seismic node. Some embodiments include determining if the seismic data acquisition unit satisfies a criterion for future usage based at least in part on the battery performance information.

In some embodiments, the device includes at least one selected from the list consisting of: a mobile computer, a mobile phone, a mobile medical device, a mobile media player, a tablet computing device, a vehicle, a vehicle component, a mobile power supply, and a mobile communication device.

In some embodiments, the performance model is based at least in part on experimental battery performance data for a battery type corresponding to the battery.

In some embodiments, the performance model is based at least in part on performance data for a plurality of sample devices corresponding to the device.

In some embodiments, the battery performance information includes at least one selected from the list consisting of: battery capacity, available battery usage lifetime, battery charge cycling information, battery thermal cycling information, battery rapid aging information, battery thermal performance information, battery charge rate, battery discharge rate, battery charge capacity, battery discharge capacity, battery state of charge monitor information, battery state of health monitor information, battery energy, battery internal impedance, battery AC impedance, and battery Rangone curve information.

In some embodiments, the one or more operating parameters includes at least one from the list consisting of: a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, and a battery over-current protection threshold.

Some embodiments include determining operating parameter information using a sensor included in the device.

In another aspect, an apparatus for determining battery performance information indicative of a performance of a battery in a device is disclosed, the apparatus including: one or more memory storage device; a processor operatively connected to the memory storage device and configured to: receive environmental condition information indicative of environmental conditions of the device during a usage period; receive operating parameter information indicative of one or more operating parameters of the battery during the usage period; and determine the battery performance information based at least in part on: the environmental condition information; the operating parameter information; and a performance model corresponding to the battery stored on at least one of the one or more memory storage devices.

In some embodiments, the processor is configured to: receive location information indicative of a spatial and temporal location of the battery during the usage period; and generate the environmental condition information based at least in part on the location information and an environmental model indicative of the environmental conditions at the location during the usage period.

In some embodiments, the environmental model includes a weather model. In some embodiments, the weather model provides information indicative of the daily temperature at the location during the usage period. In some embodiments, the environmental model is stored on at least one of the one or more memory storage devices.

Some embodiments include a global positioning unit operatively connected to the processor and configured to acquire at least a portion of the location information. In some embodiments, the global positioning unit is included in the device. Some embodiments include a clock included in the device, the clock configured to acquire at least a portion of the temporal location information.

Some embodiments include at least one sensor configured to determine at least a portion of the environmental condition information using a sensor. In some embodiments, the sensor is included in the device. In some embodiments, the sensor includes a temperature sensor configured to determining information indicative of the temperature of the battery during the usage period.

Some embodiments include at least one communication unit operatively connected to the processor, and where the processor is configured to determine at least a portion of the environmental condition by accessing a data source located remotely from the device. In some embodiments, the data source includes a weather data source.

Some embodiments include a control unit included in the device and configured to: receive battery performance information; and control the operation of the device based at least in part on the battery performance information.

In some embodiments, the control unit is configured to control an operating parameter of the battery based at least in part on the battery performance information.

Some embodiments include an output unit configured to output the battery performance information.

In some embodiments, the device includes a seismic data acquisition unit. In some embodiments, the seismic data acquisition unit is a seismic node. In some embodiments, the seismic data acquisition unit includes: at least one seismic vibration sensor, a clock, a memory configured to store data from the sensor; the battery; and battery control electronics. In some embodiments, the battery control electronics are programmed based at least in part on the battery performance information.

In some embodiments, the processor is configured to determine if the seismic data acquisition unit is fit for a future usage based at least in part on the battery performance information.

In some embodiments, the device includes at least one selected from the list consisting of: a mobile computer, a mobile phone, a mobile medical device, a mobile media player, a tablet computing device, a vehicle, a vehicle component, a mobile power supply, and a mobile communication device.

In some embodiments, the performance model is based at least in part on experimental battery performance data for a battery type corresponding to the battery.

In some embodiments, the performance model is based at least in part on performance data for a plurality of sample devices corresponding to the device.

In some embodiments, the battery performance information includes at least one selected from the list consisting of: battery capacity, available battery usage lifetime, battery charge cycling information, battery thermal cycling information, battery rapid aging information, battery thermal performance information, battery charge rate, battery discharge rate, battery charge capacity, battery discharge capacity, battery state of charge monitor information, battery state of health monitor information, battery energy, battery internal impedance, AC impedance, and battery Rangone curve information.

In some embodiments, the one or more operating parameters includes at least one from the list consisting of: a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, and a battery over-current protection threshold Some embodiments include at least one sensor included in the device configured to determine at least a portion of the operating parameter information.

Some embodiments include the device. In some embodiments, the device includes the processor. In some embodiments, the device includes at least one of the one or more memory storage devices. In some embodiments, the device includes the one or more memory storage devices.

In another aspect, a method of predicting the usage lifetime of a seismic data acquisition unit at a selected spatial and temporal location is disclosed, the method including: receiving an environmental model predictive of one or more environmental condition of the seismic data acquisition unit at a selected spatial and temporal location; receiving a seismic data acquisition unit performance model predictive of one or more operating parameter of the data acquisition unit; receiving a battery performance model predictive of the performance of a battery used to power the data acquisition unit as a function of the environmental condition and operating parameter of the seismic unit; and determining the usage lifetime of a seismic data acquisition unit at a selected spatial and temporal location based at least in part on: the selected spatial and temporal location, the environmental model; the seismic data acquisition unit performance model; and battery performance model.

In some embodiments, determining the usage lifetime of a seismic data acquisition unit includes: using the environmental model to predict the more environmental condition of the seismic data acquisition unit based at least in part on the selected spatial and temporal location; using the seismic data acquisition unit performance model to predict an operating parameter of the data acquisition unit performance; and using the a battery performance model to predict the performance of the battery used to power the data acquisition unit based on the predicted environmental condition and the predicted operating parameter.

Some embodiments include obtaining statistical performance data for a plurality of sample data acquisition units of type corresponding to the data acquisition unit; and generating the seismic data acquisition unit performance model based at least in part on the statistical performance data.

Some embodiments include obtaining experimental battery performance data indicative of the performance of one or more test batteries of the type used to power the data acquisition unit; and generating the battery performance model based at least in part on the experimental battery performance data.

In some embodiments, the environmental parameter includes a temperature of the device at the selected spatial and temporal location.

In some embodiments, the operating parameter includes at least one from the list consisting of: a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, and a battery over-current protection threshold Some embodiments include comparing the predicted usage lifetime of the seismic data acquisition unit to a threshold; and determining a usage status of the data acquisition unit based on the comparison. Some embodiments include deploying the seismic data acquisition unit based on the usage status.

In another aspect, a method of qualifying a battery cell type for use in a seismic data acquisition unit at a selected spatial and temporal location including: generating an environmental model predictive of one or more environmental condition of the seismic data acquisition unit at the selected spatial and temporal location; generating a seismic data acquisition unit performance model predictive of one or more operating parameter of the data acquisition unit at the selected spatial and temporal location; generating a battery performance model predictive of the performance of the battery cell type in the unit as a function of the environmental condition and operating parameter of the seismic unit; and predicting the performance of the battery cell type based at least in part on: the selected spatial and temporal location; the environmental model; the seismic data acquisition unit performance model; and battery performance model. Some embodiments include comparing the predicting the performance of the battery cell type to a performance standard and qualifying the battery cell type based on the comparison, In some embodiments, the battery cell type is characterized by a nominal discharge rate, and where the step of predicting the performance of the battery cell type includes predicting the performance of the cell type at an operational discharge rate less than the nominal discharge rate.

In some embodiments, the operational discharge rate is less than about 1%, about 0.1%, or about 0.01% of the nominal discharge rate.

In some embodiments, the battery cell type is characterized by a maximum discharge rate, and where the step of predicting the performance of the battery cell type includes predicting the performance of the cell type at an operational discharge rate less than the maximum discharge rate.

In some embodiments, the operational discharge rate is less than about 1%, about 0.1%, or about 0.01% of the maximum discharge rate.

In some embodiments, the nominal discharge rate is greater than about 1 A, and the operational discharge rate is less than about 10 mA.

In some embodiments, the nominal discharge rate is in the range of 0.5-100 A, and the operational discharge rate is in the range of 0.05-50 mA.

In some embodiments, the maximum discharge rate is greater than about 1 A, and the operational discharge rate is less than about 10 mA.

In some embodiments, the maximum discharge rate is in the range of 0.5-100 A, and the operational discharge rate is in the range of 0.05-50 mA.

In some embodiments, predicting the performance of the battery cell type includes: using the environmental model to predict the more environmental condition of the seismic data acquisition unit based at least in part on the selected spatial and temporal location; using the seismic data acquisition unit performance model to predict an operating parameter of the data acquisition unit performance; and using the a battery performance model to predict the performance of the battery used to power the data acquisition unit based on the predicted environmental condition and the predicted operating parameter.

Some embodiments include obtaining statistical performance data for a plurality of sample data acquisition units of type corresponding to the data acquisition unit; and generating the seismic data acquisition unit performance model based at least in part on the statistical performance data.

Some embodiments include obtaining experimental battery performance data indicative of the performance of the battery cell type; and generating the battery performance model based at least in part on experimental battery performance data.

In some embodiments, the environmental parameter includes a temperature of the device at the selected spatial and temporal location.

In some embodiments, the operating parameter includes at least one from the list consisting of: a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, and a battery over-current protection threshold.

Note that as used herein, a battery may refer to an energy storage device comprising a single battery cell or multiple battery cells with or without other elements such as electrical connections, housing or other packaging elements, or any other suitable battery components.

In various embodiments, any of the above described devices, techniques, systems, elements, steps, etc. may be used, either alone, or in any suitable combination.

BRIEF DESCRIPTION OF DRAWINGS

The accompanying drawings are not intended to be drawn to scale.

FIG. 1 shows a schematic diagram of a seismic recording unit.

FIGS. 5a and 5b illustrate daily and yearly temperature profiles with a radiation model. Specifically, FIG. 5a illustrates normalized daily temperature fluctuations taken from two geographic regions, one with high solar radiation and the other with low. FIG. 5b illustrates an artificial 4-year temperature profile that includes six of the coldest arctic months from Prudhoe Bay on the northern coast of Alaska and six of the hottest months from Khartoum, Sudan.

FIG. 9b is a functional block diagram of the mobile phone of FIG. 9a

DETAILED DESCRIPTION

Figure 2A:
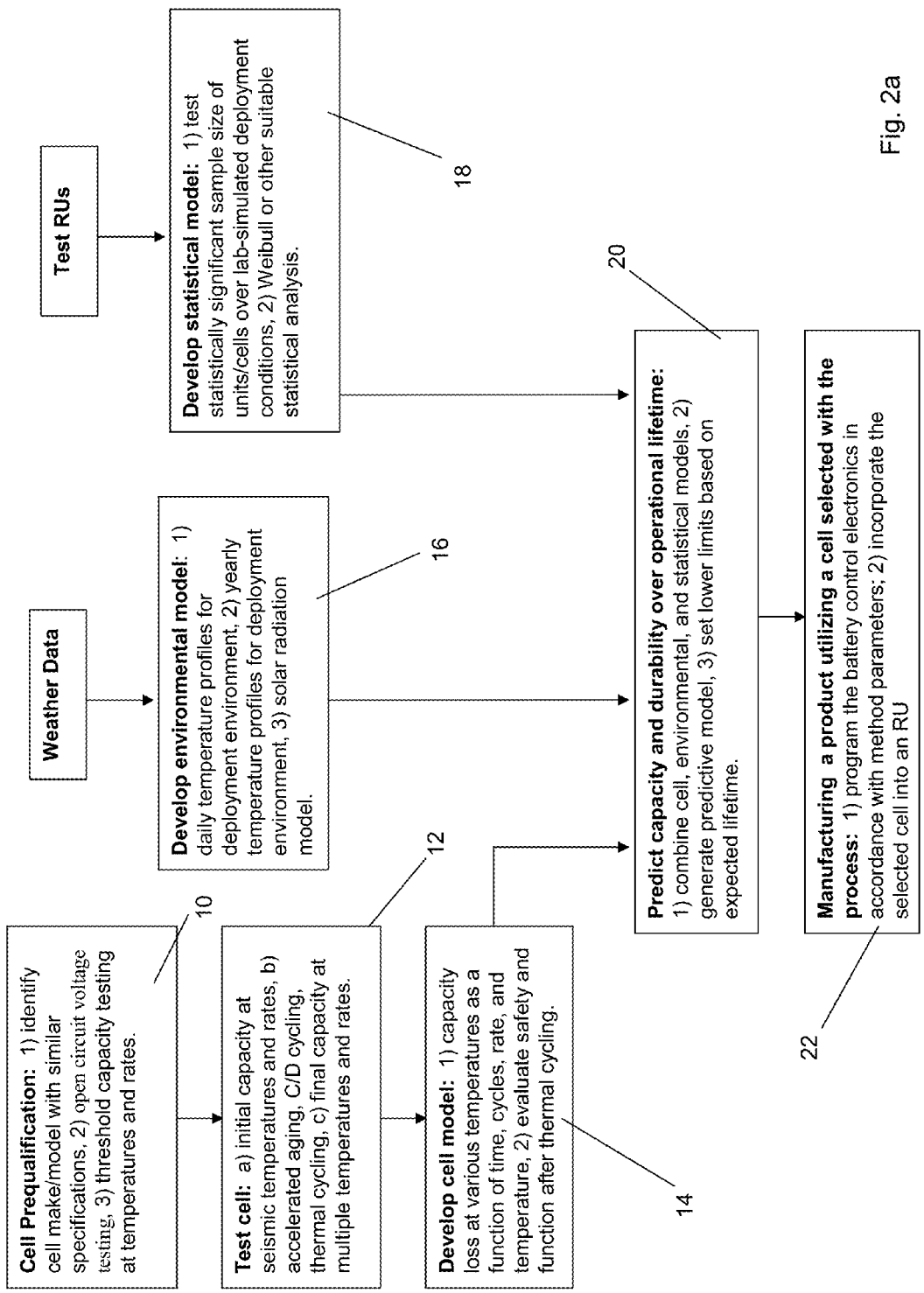
FIG. 2a shows the general flow chart of the method used to qualify battery cells.

Some embodiments include a quantitative qualification method for battery cells to identify those cells with the qualifications for use in seismic environments. Some embodiments provide a modeling methodology for battery operated devices that results in a prediction model for capacity and durability over a period of time, e.g., years of usage, taking into account weather environments that may range from extreme cold to extreme heat. While the seismic usage regime will be described primarily for use with rechargeable lithium ion batteries, the method is not limited to either the seismic field or a particular type of rechargeable battery.

It has been discovered that at very low discharge rates, cells (and therefore batteries comprised of one or more cells) can be operated well below the temperature specification of the cells. Since RUs utilized in seismic acquisition oftentimes operate at very low discharge rates over an extended period of time, it has been found that the foregoing discovery is well suited for implementation in seismic acquisition systems. However, in various embodiments, it is advantageous to provide a better understanding of the possible operation of a make/model cell under the operating conditions of such a device to a satisfactory confidence level.

Some examples provided in this disclosure are particularly focused on qualifying and modeling cells in operational ranges well below the temperature specification of the cells. In one regard, a method is disclosed of incorporating a set of tests, analyses, and predictive models that allows comparison of similarly specified cell makes/models from various manufacturers to evaluate and determine which of the cells are most desirable for use in a particular application, e.g., a seismic application, at temperatures beyond the standard operating parameters of the cells.

Some embodiments include method for qualifying cells. In other embodiments, the set of tests and models utilized to predict cell response outside operating parameters so that a particular cell make/model may be selected, incorporated and utilized in a seismic device.

Moreover, in some embodiments, based on the developed predictive models, a device such as an RU can be monitored over its life, and historical and expected deployments can be utilized to predict how the RU will perform in an anticipated environment.

Generally, it would be undesirable to utilize a cell far below its specified "operational" rate. For this reason, conventional techniques are not designed to evaluate cells far below the specified operational rate. In fact, typically, conventional techniques focus on evaluation of the maximum discharge rate so the cells do not overheat. However, the discharge rate of a cell employed in seismic devices may be more than several orders of magnitude lower than the maximum discharge rate of the cell. As such, the discharge rate of cells used in seismic investigations, particularly in environments of extreme cold, approaches zero and could potentially encounter unanticipated regimes of chemical reactions and unexpected benefits or problems. As such, the usage evaluation regimes of this disclosure provide unique advantages.

In seismic application at low temperatures, the discharge rate can determine the difference between adequate capacity and zero capacity. For example, below −20° C., many cell models drop capacity rapidly and have no capacity below −30° C. for high discharge devices. When run at low discharge rates, however, some cell models still have little or no capacity below −30° C., while others have adequate capacity. Through use of the techniques in this disclosure, it is possible to identify those cell makes/models that retain adequate capacity at extremely low temperatures, such as temperature below 0° C., −10° C., −20° C., −30° C., −40° C., or lower in the extremely low discharge rate regime unique to seismic units, e.g., at discharge currents of less than 1.0 mA, 0.5 mA, 0.1 mA, 0.01 mA or less, or at discharge rates (as defined below) of less than 0.1 C, 0.01 C, 0.001 C, 0.001 C or less.

It is to be understood that in some embodiments, a similar approach may be used to qualify cells for use at high temperatures e.g., temperatures above 25° C., 30° C., 40° C., 50° C. or more. Similarly these techniques may be adapted for qualifying cells that are subject to large temperature cycles, e.g., where the maximum to minimum temperature swing is at least 20° C., 30° C., 40° C., 50° C., 60° C. or more.

Referring to FIG. 1, seismic data recording units, or RUs 1000, are generally characterized as having at least one geophone 1001, a clock 1002 for controlling operations of the RU, one or more rechargeable batteries 1003, a seismic data recorder 1004 and control electronics 1005, including battery control electronics and local memory 1006 for storing operational and control software and code. Of course it is to be understood that in some embodiments some of these elements may be omitted, or additional elements included. For example, in some cases, seismic data recorder components may be eliminated to the extent seismic data is transmitted without local recording.

As shown the RU 1000 is a seismic node, where the all of operative components of the RU 1000 are contained within a housing without any cabled connection to any external elements. As will be understood by one skilled in the art, such nodes can be independently positioned (e.g., in difficult terrain above ground, on the ocean bottom, etc.). Exemplary seismic nodes of this type include the ZNODAL® line of seismic sensors available from FairfiledNodal of 1111 Gillingham Lane, Sugar Land, Tex.

In some embodiments, the control electronics 1006 may be programmed with software utilizing operating parameters based on the environment in which the RU is deployed. Use of the term "battery" or "battery pack" refers to a combination of one or more cells, possibly with additional components such as electrical connections or packaging materials. As used herein, a "cell" or "raw cell" refers to a power source.

Table 1 illustrates the regime of operation for lithium ion batteries used in seismic RU applications and compares this to other applications. Operating parameters that set seismic applications apart from conventional battery usage such as commercial and automotive are the required cycle life, low discharge rate, and low discharge temperature. Commonality includes the need to maximize capacity, safety requirements, and battery charging conditions.

The discharge rate of batteries is defined in terms of the total capacity C discharged within an hour. For example a 2.6 Ah capacity battery discharged at 2.6 amperes will deplete in one hour, and therefore discharged at a rate of 1 C. The same battery discharged at 1.3 amperes will deplete half its capacity in one hour, so the rate would be 0.5 C. The discharge rate in seismic applications is up to 3 orders of magnitude slower than commercial and automotive applications. This slow rate results in days or weeks of continuous discharge before a charge is required, and so the number of cycles of the battery may be counted in the low 10's per year. These are two important advantages enjoyed by seismic applications, while a significant disadvantage is the required discharge temperature, especially in extremely cold environments. This combination of advantages and disadvantages is characteristic to certain seismic RU applications. The behavior of batteries in the "seismic regime" (very low temperatures and very low discharge rates) is typically not specified by battery makers. Moreover, how the materials and chemistry will perform is not obvious, especially with aging and cycling.

Therefore qualification of battery technology for seismic requires unique procedures such as described here. While the method of the invention will be described in terms of use of the batteries (and cells) for seismic devices, it should be understood that the method described here can apply to applications other than seismic, where the application regime significantly falls outside normal cell operating specifications.

TABLE 1

Exemplary lithium-based battery comparison, illustrating the unique requirements of seismic RUs

| Application | Cycles | Discharge Rate | Discharge Temperature |
|---|---|---|---|
| Commercial | 300 | 1 to 2 C | −20 to 60° C. |
| Automotive | 2500 | Up to 3 C pulse | −25 to 50° C. |
| Seismic | 100 to 150 | 0.003 C typical | −40 to 60° C. |

FIG. 2a shows the general flow chart of the method used to qualify batteries in accordance with this disclosure.

Figure 2B:
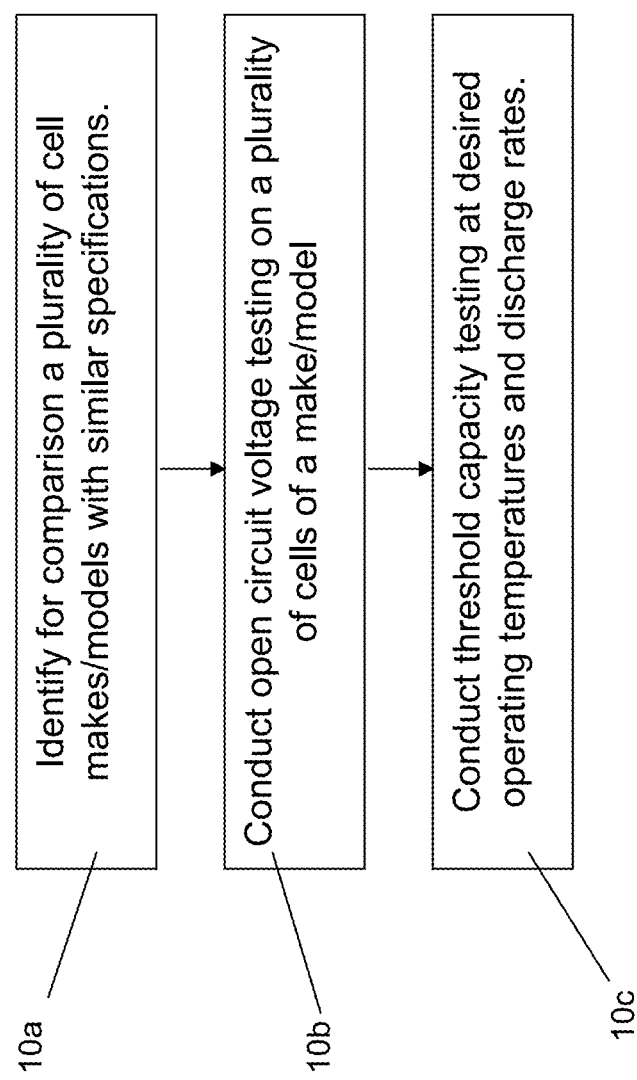
FIG. 2b shows a method of battery cell prequalification.

While the following discussion will focus primarily on predictions related to a particular make/model cell, it may be necessary to first select one or several makes/models of cells for evaluation through a prequalification or preliminary evaluation. This preliminary evaluation is generally represented by step 10 in FIG. 2a, and also by steps 10a, 10b and 10c in FIG. 2b. While step 10 is may be omitted in some embodiments, it is preferable in order to cull out those makes/models of cells that are clearly not well suited for further investigation and analysis. As shown in FIG. 2b, in step 10a, a plurality of cells of differing makes/models may be selected for preliminary screening. The plurality of makes/models for comparison are selected to have the same or substantially the same operational specifications in order to normalize the comparison. Thereafter, to evaluate a particular make/model for further modeling, in step 10b, the open circuit voltage for a plurality of cells from the same make/model lot are measured after a base level charge, such as their as-shipped state removed fresh from a new carton. Step 10b is repeated for each make/model. Makes/models displaying a wide variation in the open circuit voltage for the plurality of cells tested for the particular make/model are rejected.

Those makes/models that exhibit minimal open circuit voltage variation among the cells of the particular make/model are then subjected in step 10c to discharge testing across a range of temperatures, preferably utilizing a test chamber to maintain constant and repeatable temperature conditions. Only a portion of the cells within a particular make/model group need be tested in this step since this step is used only to determine a representative capacity for the overall make/model group. The cells are fully charged and subsequently discharged at different temperatures. The results of this test can normally be compared, e.g., as different temperature curves on a Ragone chart, such as is shown in FIG. 3.

The temperature curves preferably represent at least a nominal temperature such as room temperature TR (typically approximately 25° C.) and a desired operating temperature TO. Note that at the nominal temperature TR the cell capacity is close to its nominal value, usually quoted at approximately 25° C. However, depending on the cell make/model, the capacity may be assumed to be close to its nominal value over a wide temperature range that could include temperatures both below and above 25° C. Thus TR is not restricted to approximately 25° C., although in most of the discussion that follows room temperature (23° C.–25° C.) was chosen for convenience. As one non-limiting example, TR was taken as 65° C. during a portion of the statistical analysis, described below.

Figure 3:
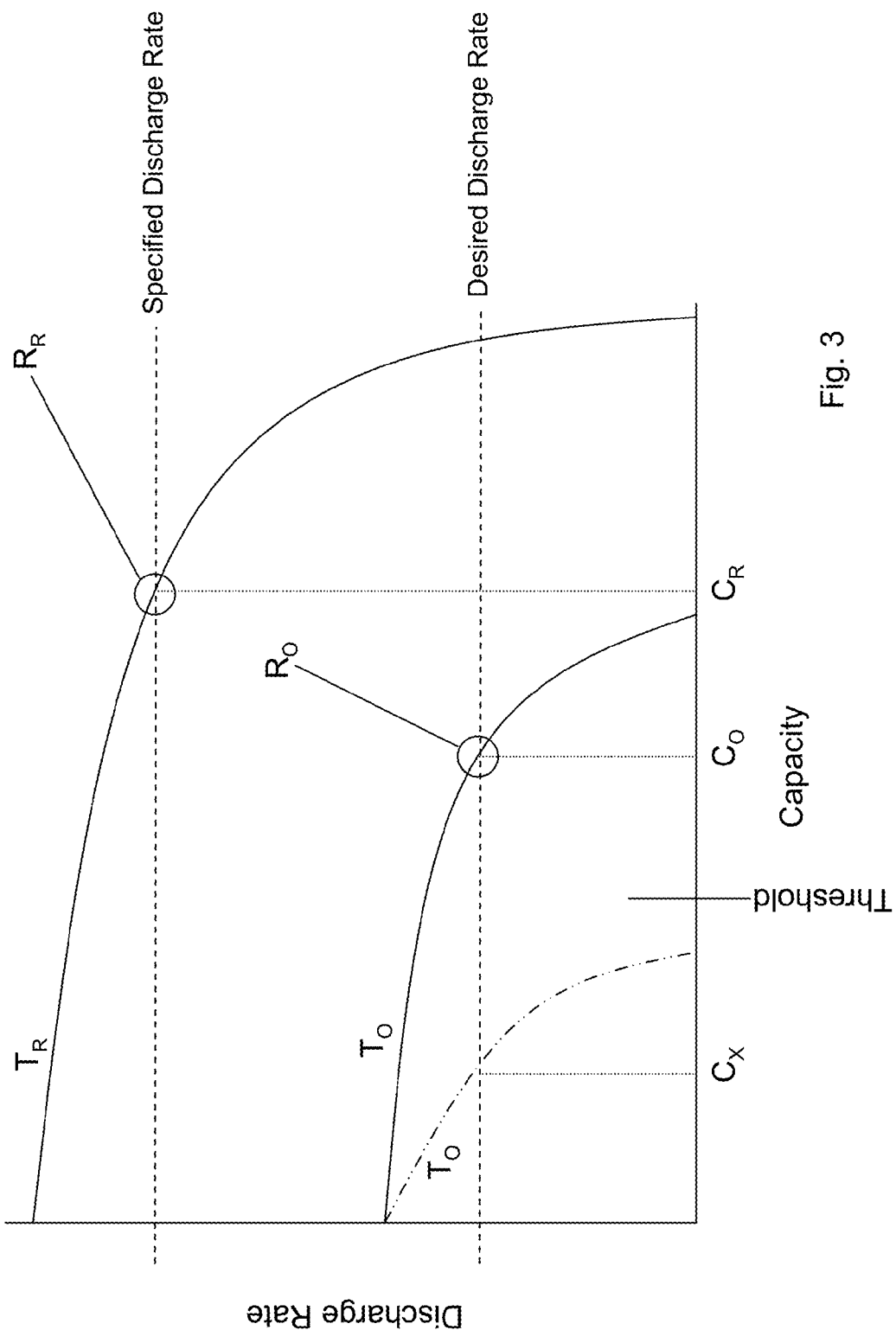
FIG. 3 shows a plot of battery cell discharge rate as a function of capacity at multiple temperatures.

FIG. 3 plots a discharge rate at room temperature TR in accordance with the specifications as well as and a desired discharge rate. The intersection RR of the cell's specified discharge rate with the room temperature TR curve yields the specified capacity CR. The intersection RO of the desired discharge rate with the desired operating temperature TO curve yields a capacity CO which can be used at this stage as the representative capacity for the make/model of cells. In some embodiments, it is desirable to identify those cell makes/models with a capacity CO as close as possible to the specified capacity CR. Put another way, if the desired operating temperature TO curve for a particular cell drops off too quickly, the make/model of cells represented by the tested cell will not be suitable for the intended use. As such, the make/model cells can be discarded from continued analysis and investigation. Only those make/model cells with a representative capacity above a select threshold will be considered as candidates for use in the RU. In the illustrated Ragone chart, therefore, the discharge curve with a capacity of CX would be representative of a make/model cell that is less desirable than the make/model cell exhibiting a capacity of CO for the same desired operating temperature. Thus a desired discharge capacity is selected based on the discharge requirements of the RU. Only those make/model cells that exhibit a representative discharge capacity above the threshold are appropriate for on-going modeling in accordance with the invention. Of course, persons of ordinary skill in the art will appreciate that the test may also be conducted at an intermediate temperature between room temperature TR and the desired operating temperature TO and that any cell that does not display sufficient capacity at the intermediate temperature can be discarded out of hand since it is not capable of sufficient capacity at the desired operating temperature TO.

Having preliminarily screened a particular cell make/model in accordance with one or more of the steps 10a-10c, the cell make/model may then be subjected to the additional steps of FIG. 2a. In step 12, each raw cell within a make/model group is tested. Testing of each cell involves three sub-steps: 1) sub-step 12a, determining initial capacity of each cell at temperatures and rates inside and outside the cells standard specified operating parameters, such as TR/RR and TO/RO, 2) sub-step 12b, performing at least one of accelerated aging, and/or capacity cycling and/or thermal cycling on each cell, and 3) sub-step 12c, identifying final capacity at multiple temperatures and rates for each cell following aging and/or cycling. Similar to accelerated life testing, the method involves testing initial performance, aging and cycling the cells, and testing the final performance. One unique feature to this method is that the performance testing is done within the seismic regime of operation, that is, at low rates and extreme temperatures, in addition to the conventional regime with its specified rate and temperature ranges.

In one embodiment, tests require a total of approximately 100 cells, all from the same batch, model, and maker. It is assumed that all cells of this make/model perform the same. So during manufacture, qualified cell make/models can be built into an RU without testing. However, those of ordinary skill in the art will appreciate that lot-to-lot cell differences are a potential exception to the assumption, and for quality assurance (QA) purposes, a subset of some of these tests may be run on a sample of cells from a particular lot. If they pass, it is assumed the rest of the cells in the lot are good and will be used in product.

Further, while the cells may be tested at a variety of temperatures, it is preferable to utilize at least the room temperature TR (approximately 25° C.) and the desired operating temperature TO in order to identify points RR and RO, as well as the corresponding capacities CR and CO for each of the cells.

More particularly, in sub-step 12a, the initial capacity for each cell from the plurality of cells for the particular make/model is determined by first fully charging each cell and then fully discharging the cell to depletion. Capacity can be calculated from voltage, current, and time measurements for both charge and discharge, though it is the discharge that is relevant for the investigation. Capacity may be determined at any discharge rate and temperature, but preferably includes the desired discharge rate and desired operating temperature TO as well as the specified discharge rate and room temperature TR. Therefore, for seismic devices, the desired operating temperature is −30° C. or below, and preferably approximately −40° C., while the desired discharge rate is less than 0.01 C, and preferably, approximately 0.003 C. As a concrete example, temperatures may be −40° C. and 25° C., and rates may be C/2 and 0.003 C. Here, −40° C. and 0.003 C are the temperature and rate typical for the seismic regime, while 25° C. and C/2 are conventional specified parameters for a cell. In any event, those of ordinary skill in the art will appreciate that in this sub-step 1, the precise capacity for each of the cells is determined. This is in contrast to the more general representative capacity determined in step 10c.

In sub-step 12b, once initial capacity for a cell or set of cells has been determined, those cells are subjected to a least one, and preferably a plurality, of accelerated life/cycling tests, which may include aging of the cells for an extended period of time; capacity cycling; and thermal cycling. Preferably each of these tests are performed.

With respect to aging, aging may be carried out over a period of time at a predetermined temperature, which may be room temperature TR, an elevated temperature, and/or at low temperatures, such as the desired operating temperature TO. Such aging may likewise be carried out while conducting capacity cycling and/or thermal cycling. For instance, some cells may age for 8 weeks at 30° C. and other cells may age for 8 weeks at 60° C.

Additionally, other cells are subjected to repeated charge/discharge cycling. For instance, some cells may be cycled 100 times. Cycling may occur at a temperature other than room temperature, and is preferably done below room temperature so as to subject the cycled cells to the least amount of thermal aging and thereby isolate the effect of charge/discharge cycling alone.

Finally, other cells may be subjected to thermal cycling. For instance, some cells may be placed in an environmental chamber and cycled from −40° C. to 10° C. Aging and thermal cycling may be done with cells at a state of charge (SOC) between full and depleted. The cells may be electrically held at their SOC or may be electrically disconnected. For example some cells may be thermally cycled at a 50% SOC disconnected from any electrical circuit, while other cells may be aged at 100% SOC and held in that state by electrically hooking them to an external power supply.

Accelerated life tests are designed to project the effects of many months or years of use. The methods may rely on theoretical equations, best/worst case bracketing, and extrapolation. In this embodiment, the accelerated life test parameters were chosen to project lifetimes for both conventional and seismic usage, but do not necessarily coincide with conventional or seismic operating parameters.

Additional testing under step 12b that may be performed includes fast cycling, which is done to determine temperature rise in cells prior to cycling experiments; and other chemical analyses to determine electrolyte freezing temperature, etc.

In sub-step 12c, after accelerated life/cycling testing has been performed, the capacity of the cells subjected to aging and/or cycling and/or other tests in step 12b is retested. The amount of aging or cycling may be less than the full amount (interval or interim) or the full amount (final). The procedure for capacity measurement should be identical to that given in sub-step 12a using the same parameters. These parameters are generally selected based on the expected "operating parameters" of the RU, namely −40° C. and rate=0.003 C. In contrast, "conventional operating parameters" are typically 25° C. and rate=C/2. In addition, interim capacity measurements also may be made during the sub-step 12b tests, such as at 1/4, 1/2, and 3/4 points along the way, either a number of weeks or cycles. This may be done to generate additional data points to form a curve that could be used for interpolation, extrapolation, or chemical analysis. Retest capacity in sub-step 12c is conducted in order to determine the amount of capacity permanently lost through aging/cycling. Those of ordinary skill in the art will appreciate that for seismic applications, lost capacity decreases the available days for deployment. Thus, in the very least, upon completion of sub-step 12c, for each cell there should be a set of data representing capacity loss, i.e., the difference between the cell capacity as determined in sub-step 12a and the cell capacity as determined in sub-step 12c.

The next step 14 is to utilize the results of the cell testing in step 12 to develop a cell model. The cell model is generally a family of curves representing capacity loss. A first set of curves is developed utilizing capacity loss versus cell aging data. A second set of curves is developed utilizing capacity loss versus charge-discharge cycling data. Thermal cycling data, on the other hand, is not plotted, but is utilized on a pass/fail basis—if a cell fails the thermal cycling, this becomes a basis for rejecting the entire make/model from further consideration. All of the foregoing collectively represent the cell "model." It should be noted that "model" as used herein means predictive mathematical models rather than physical cell make/model.

Figure 4A:
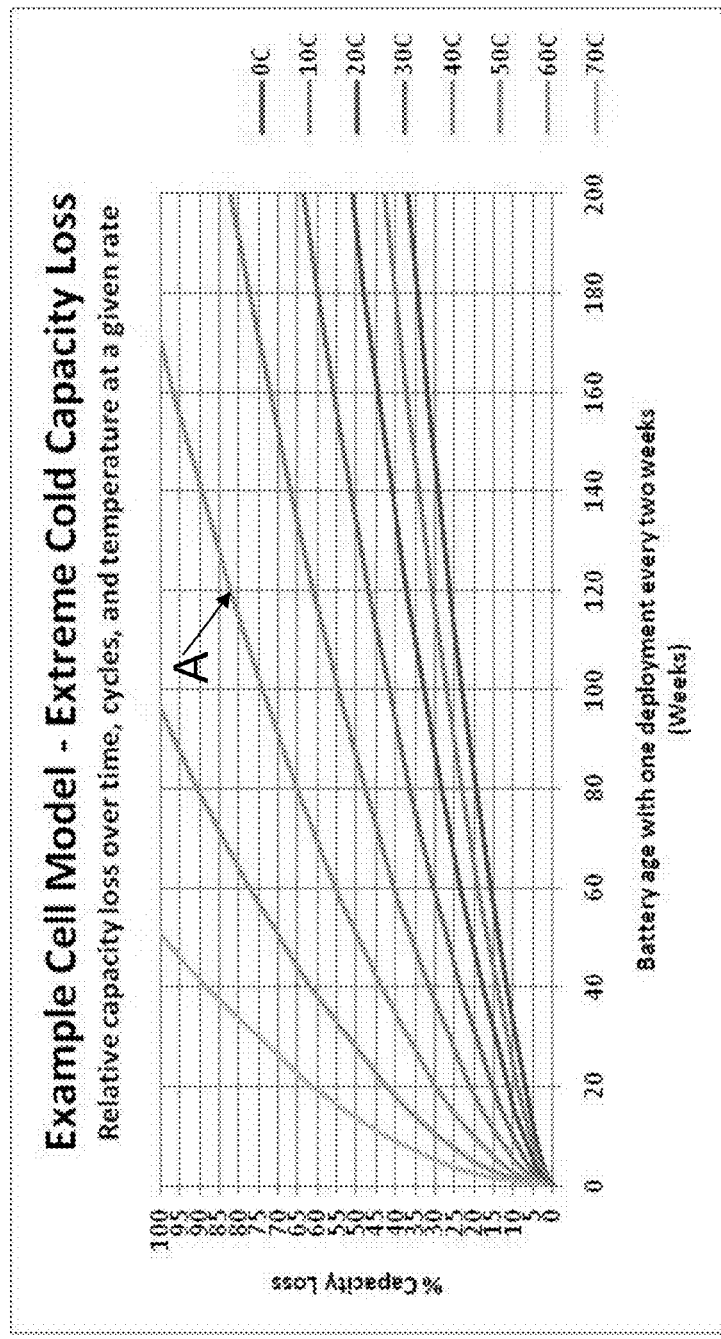
FIG. 4a illustrates cold temperature capacity loss with a plot of battery cell capacity loss as a function of battery cell age at various discharge rates for an exemplary battery cell model.
Figure 4B:
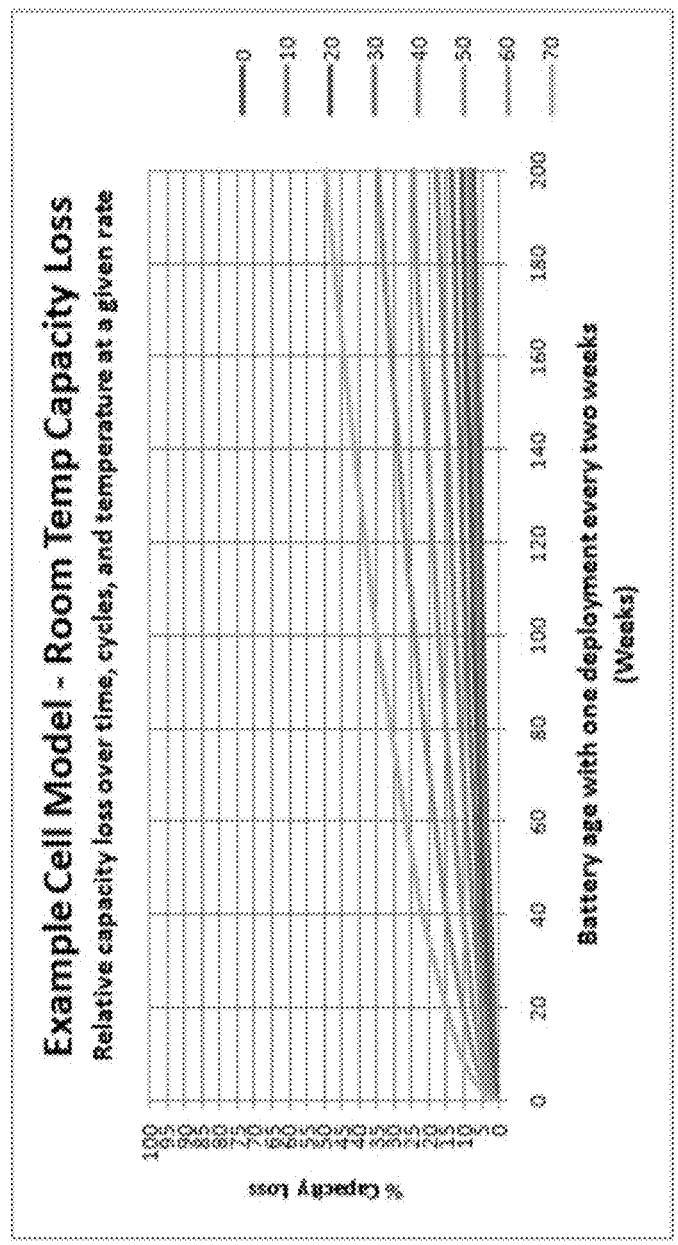
FIG. 4b illustrates room temperature capacity loss with a plot of battery cell capacity loss as a function of battery cell age at various discharge rates for an exemplary battery cell model.

In FIGS. 4a and 4b, the effects of cell aging are modeled based on Arrhenius theory. Persons of ordinary skill in the art will appreciate that Arrhenius theory describes the changing rate of chemical reactions based on temperature. FIG. 4a shows an example of a cell model for a particular lithium ion cell make/model, tested under conditions specific to the seismic RU regime outside the standard operating range, namely at a desired operating temperature, which in the case of the example, is −40° C. It illustrates the anticipated cold capacity lost by the cells resulting from Arrhenius and other analyses for a cell that is charged and discharged every two weeks. FIG. 4b illustrates the same cell tested within the standard operating range for the cell, preferably under room temperature conditions and within the specifications of the cell. As illustrated in these two figures, the chemical reactions that cause aging are faster under warmer conditions. Additionally, chemical layer growth theory may be used, and one or more empirical analyses may be performed to fit curves to test data. In the particular example of FIG. 3a, the cells tested are expected to lose approximately 25% of their initial cold capacity after 120 weeks spent at 0° C., at a given discharge rate. However, if the same cells were to have spent 120 weeks at 60° C., there is projected to be no capacity remaining for cold discharge deployments.

Because the accelerated life test parameters do not necessarily coincide with operating parameters, the cell model is more than simple graphs of test data. Rather, the graphs are used to estimate chemical aging parameters following application Arrhenius theory. The chemical aging parameters are then used to generate the aging model at any temperature, resulting in a family of curves representing capacity loss mentioned above. The final cell model is the combination of both families of curves, and represents capacity loss due to aging and cycling. This model encompasses seismic ranges of cycle, rate, and temperature as in FIG. 4.

The Arrhenius equation is a simple formula for the temperature dependence of the reaction rate constant, k, and therefore, rate of a chemical reaction, in this case, the capacity loss of the cell:

$$k = A e^{-E_a/(RT)}$$

where A is the pre-exponential factor, $E_a$ is the activation energy, T is the absolute temperature in Kelvin, and R is the Universal gas constant.

All of the curves that are generated from these tests are in general non-linear, though in some cases, some may be approximated by linear curves, if appropriate. The mathematical forms of the equations follow Arrhenius theory, chemical layer growth theory, and empirical trends.

With on-going reference to FIGS. 4a and 4b, there are two types of capacity loss. First is temporary capacity loss. A cold cell will deliver less energy to a load than a cell at room temperature. But cold does not harm the cell, so the loss lasts only as long as the cell is in cold conditions. Second is permanent capacity loss. After weeks or months of use at high temperatures, a cell will have less total capacity than another cell of the same type used in moderate temperatures. The capacity is permanently decreased.

FIG. 4a illustrates permanent loss from high temperature aging, but only for cells used in cold conditions. For example, if a new cell has been measure to have a true 2.4 Ah capacity at room temperature, that same cell may deliver only 1.8 Ah of capacity if used at −40° C., resulting in a 25% reduction (or an absolute 0.6 Ah loss). However, the cell is not harmed by the cold, so the reduction is temporary. Its cold capacity is 1.8 Ah, while its room temp capacity is 2.4 Ah. Therefore the permanent capacity loss in FIG. 3a is relative to 1.8 Ah. If the cell is used in a device that has been maintained for 120 weeks at +50° C., and charged/discharged 60 times over that period, from FIG. 3a (A) it will have lost 82% of its cold capacity due to aging and cycling losses. That is, it can no longer be considered to have 1.8 Ah cold capacity, but now can only deliver 0.32 Ah (1.8 Ah*0.82=1.48 Ah loss) at −40° C. (Note that as shown in FIG. 3b, it will have also lost room temperature capacity, so it now will deliver less than 2.4 Ah.) This 82% loss is permanent. So the 0.32 Ah is reduced from the true 2.4 Ah it originally had by both temporary (0.6 Ah due to cold usage) and permanent loss (an additional 1.48 Ah due to hot aging plus charge/discharge cycling).

In developing the cell model, thermal cycling may be performed to test mechanical integrity of the cells after many thermal expansions and contractions, as well as many electrolyte phase changes. If a cell develops cracks or leaks, it may represent a safety problem. If it remains mechanically stable, but does not perform adequately (subsequent capacity subsequent not equal to prior capacity), it is a functional failure.

With on-going reference to FIG. 2 and turning to FIGS. 5a and 5b, in step 16, an environmental model is developed. The environmental model may be one or more temperature curves. The environmental model is preferably based on the anticipated location of deployment of an RU. However, the temperature curve(s) is independent of the cell make/model that is the focus of steps 12-14. FIGS. 5a and 5b illustrate daily and yearly temperature profiles with radiation model. Specifically, FIG. 5a illustrates normalized daily temperature fluctuations taken from two geographic regions, one with high solar radiation and the other with low. FIG. 5b illustrates an artificial 4-year temperature profile that includes six of the coldest arctic months from Prudhoe Bay on the northern coast of Alaska and six of the hottest months from Khartoum, Sudan. The figure shows daily high and low temperatures that include a strong solar radiation model for Khartoum, which results in high temperatures approaching 60° C. many days. Of course, the foregoing locations are only provided for illustrative purposes and the environmental model can be developed for any location as desired.

FIG. 5a is a 24 hour period and FIG. 5b is a 4-year period. FIG. 5a shows temperature fluctuations in two cases. The first is for a "long day" in the summer at warm latitudes. The second is a short day during winter at cold latitudes. It represents normalized air temperature. Because air temperature can be significantly different than the surface temperature of a street or desert sand, the magnitude of temperature increase in maximum sun exposure is characterized as "high" radiation. "Low" radiation is a small percentage of "high", and may be practically zero for weeks at a time in arctic regions during the winter solstice. This solar radiation refers to not only sun position, but also cloud cover or shade.

The combination of yearly and daily temperature profiles is used to generate a realistic integrated or accumulated time-at-temperature for a seismic RU system continuously deployed in worst-case environments. Environmental models can be combined with cell models, as described below, to predict capacity loss at any point in time of the service life of a seismic RU. At this point the predictive model addresses the concerns of a single battery with some usage history.

Figure 6A:
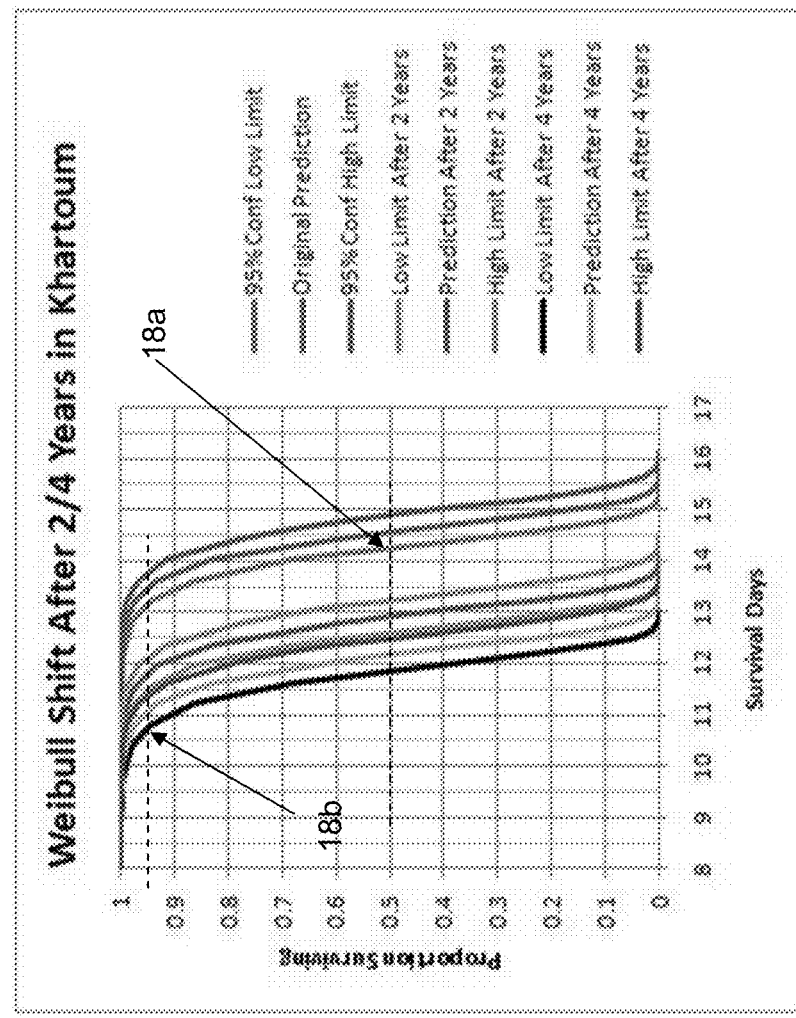
FIGS. 6a and 6b show a statistical model for a large group of seismic recording units within a standard operating temperature range, such as at a nominal temperature of 25° C., and at a desired operating temperature, such as −40° C., respectively.
Figure 6B:
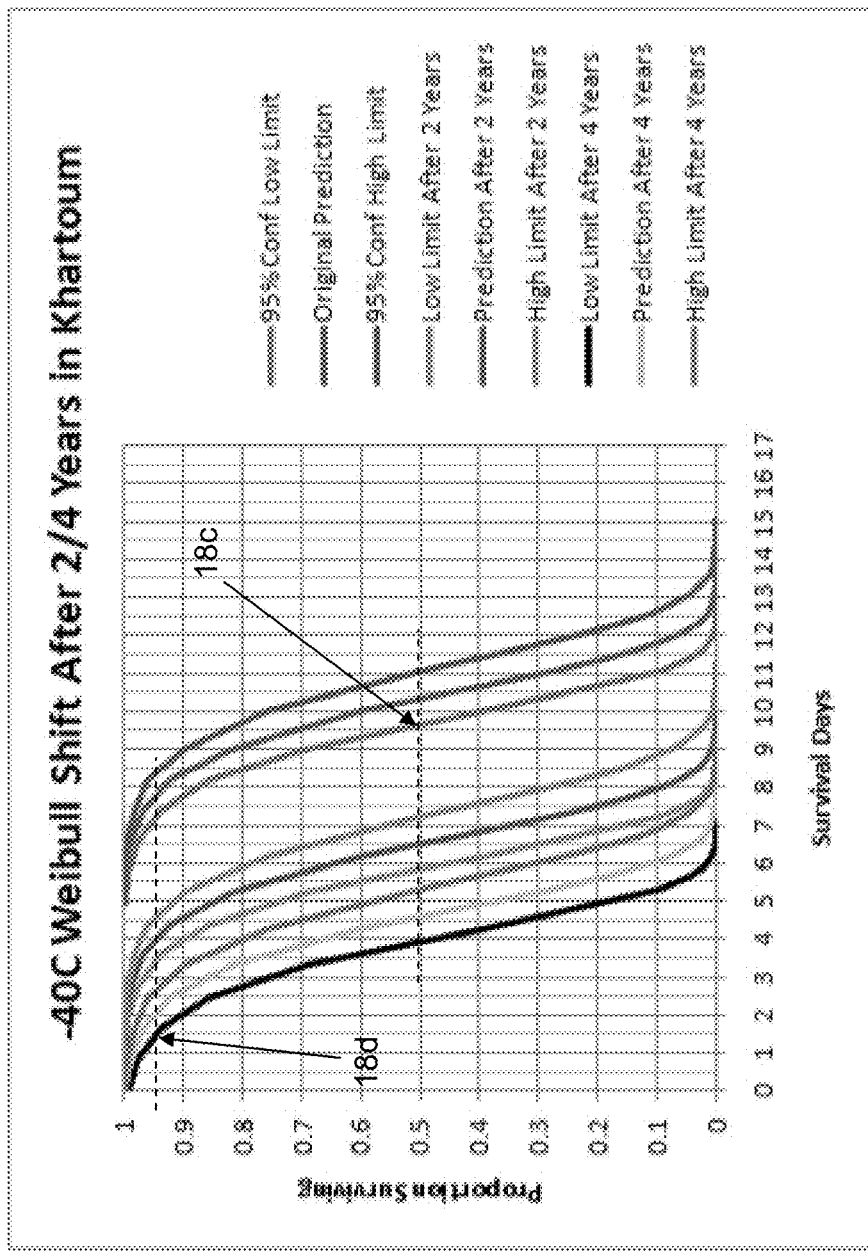

With on-going reference to FIG. 1 and turning to FIGS. 6a and 6b, in step 18, a statistical model is developed. Generally, the statistical model may be based upon any probability density function that approximates the survival of rechargeable batteries, such as the Gaussian distribution or non-Gaussian distributions. The statistical model used here is preferably one or more Weibull curves based on the Weibull distribution, which is the most appropriate distribution to use in survival analysis.

The data for the statistical model is preferably generated at both a given temperature TR and a desired operating temperature TO, and represent a statistical analysis at these temperatures of surviving seismic RUs after time of a given deployment. Preferably a Weibull curve is generated for each RR and RO. The curves predict, when an RU is being redeployed, the time period, such as for example, days, a particular RU with a particular cell(s) will survive after a defined period of deployment.

More specifically, in step 18, the statistical model is generated by utilizing a plurality of fully charged RUs set for acquisition mode that are placed in an environmental chamber and allowed to fully deplete. Preferably, the environmental chamber was held approximately both −40° C. and 60° C. The time duration can be determined after all units are depleted. The plot of proportion of units surviving versus days can be fit to a Weibull function through regression. The curve fit is what is shown in FIGS. 6a and 6b, rather than the raw data.

The Weibull function is a convenient distribution for statistics involving survival durations. It allows the estimation of confidence intervals around the curve fit line, which can give the reader a certain percent confidence that the "real" curve is within the interval somewhere. Additionally, confidence limits can be estimated to give a percentage confidence that another sample from the same population will be within the limits.

With this in mind, FIGS. 6a and 6b show a statistical model for a large group of seismic RUs within a standard operating temperature range, such as at a nominal temperature of 25° C., and at a desired operating temperature, such as −40° C., respectively. The "original prediction" Weibull curve shows results from separate tests of the duration of new batteries in use under lab-simulated temperature conditions.

As shown by curve 18a, the particular example of FIG. 6a indicates that at a nominal temperature, 50% the RUs tested are expected (based on a 95% confidence level) to last less than 14.5 days while the remaining proportion may last longer. The statistical uncertainty of the prediction lies within the high and low 95% confidence limit. The results of the cell models may be applied to the statistical curves, effectively shifting the curves to the left depending on the usage history considered. FIG. 6a shows the shift to the left for 2 and 4 years of anticipated usage in Khartoum, as examples. Thus curve 18b, for instance, represents the proportion of seismic RUs expected to survive after a number of days during a given deployment, after having been deployed continuously in Khartoum for a span of 4 years, with 95% statistical confidence. It indicates 95% of the units of the system should survive between 10.5 and 11 days with initially fully charged batteries.

In contrast, as shown by curve 18c in FIG. 6b, using the particular example, at a temperature of −40° C., 50% the RUs tested are expected (based on a 95% confidence level) to last less than 10.5 days while the remaining proportion may last longer. Similarly, results of the cell model were applied to the statistical curves shifting them to the left per the considered usage history, or 2 and 4 years in Khartoum in this example. Curve 18d, represents the proportion of seismic RUs expected to survive after a number of days during a given deployment, after having been deployed continuously in Khartoum for a span of 4 years, with 95% statistical confidence. It indicates 95% of the units of the system should survive more than 1.5 days with initially fully charged batteries.

As one non-limiting example, for FIG. 6a, 23 RU units were run at 65° C. until they depleted. The first dropped out at 13.6 days, and by 15.8 days they had all ceased functioning. The line labeled "original prediction" is the Weibull curve fit to the 23 data points. It shows 50% of the units were expected to drop out by 14.5 days. The data points themselves fall along the "original prediction" curve, which resulted in a very tight 95% confidence interval around the regression line (not show). The calculated 95% confidence limits (shown) were less than +/−half a day, meaning that if many more than 23 units had been utilized, 95% of the additional units would be expected to fit within the confidence band.

The preceding discussion of FIGS. 6a and 6b illustrates a beneficial aspect of this technique. As a non-limiting example, for seismic products, the low confidence limit is the primary focus because it is desirable to know in the worst case how soon might units start dying in the field so their deployment can be stopped before a significant number of units stops working. This is important because shooting with dynamite or vibrators needs to occur while units are alive in order to record the seismic data. Performance of a brand new seismic system can be predicted with just the statistical part of the model, whereas the cell and environmental models are needed to predict the performance of a system with usage history. It should be clear to those skilled in the art that this benefit extends beyond seismic applications. Any system of batteries can be statistically characterized, and performance prediction can be utilized even if other parts of the predictive model, cell and environmental models, are not employed. However, if the batteries have a usage history those additional models can be applied, to extend the predictive model to used batteries.

Figure 7:
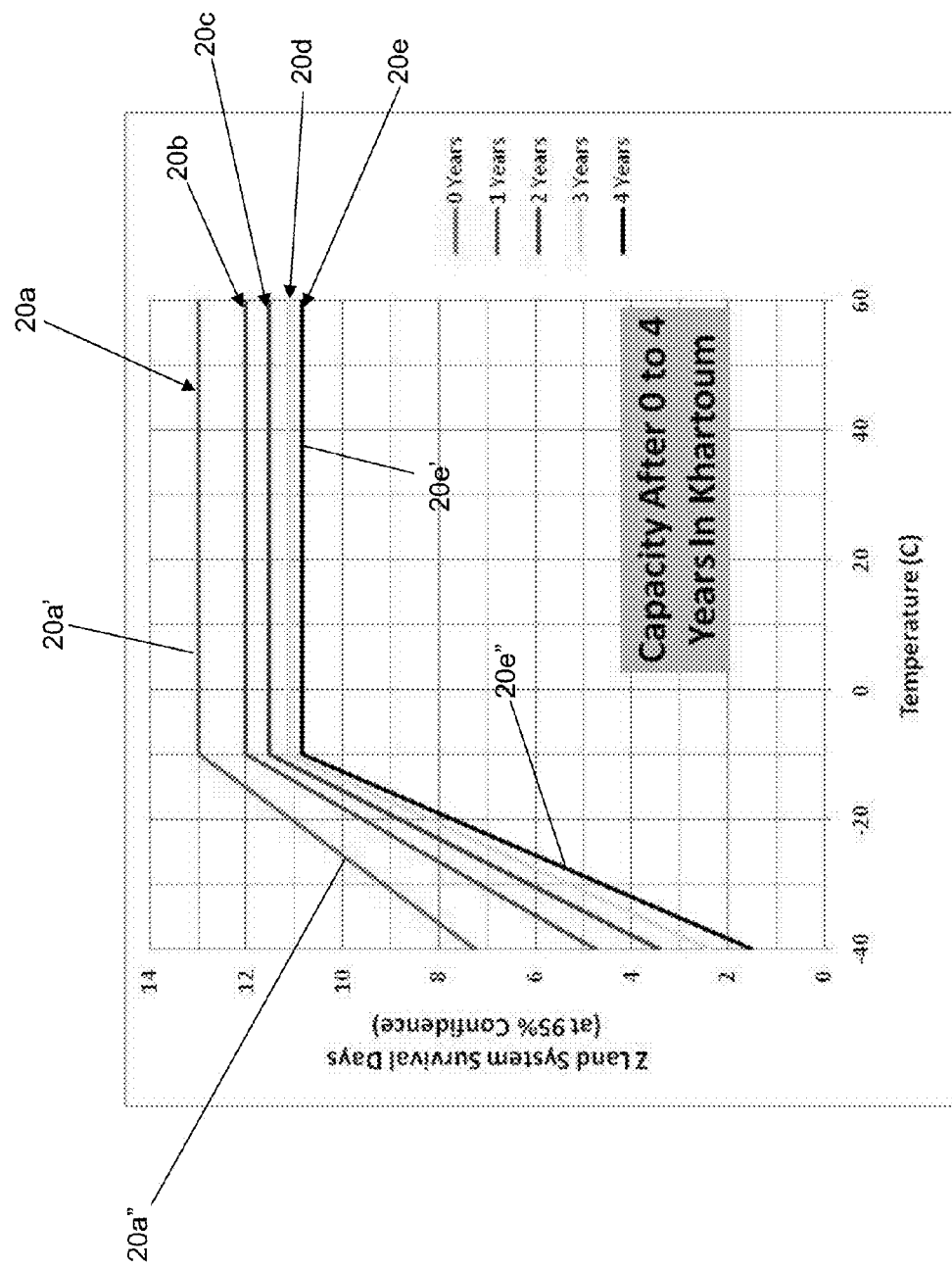
FIG. 7 shows a plot of seismic recording unit survival days as a function temperature for various unit deployment ages.

With on-going reference to FIG. 2a and turning to FIG. 7, in step 20, a combined, predictive model for seismic RU system deployment is developed, preferably utilizing each of the aforementioned cell model, environmental model and statistical model. The predictive model predicts expected survival days for the deployment of a system of seismic RUs for a period of time of continuous use in a particular location as a function of current deployment temperature. In the non-limiting illustrative example, the period of time is 0-4 years and the location is Prudhoe Bay, Ak., where line 20a represents the expected days of survival of a RU that has been deployed for 0 years, i.e., a new RU; 20b represents the expected days of survival of a RU that has been deployed for 1 year; 20c represents the expected days of survival of a RU that has been deployed for 2 years; 20d represents the expected days of survival of a RU that has been deployed for 3 years; and 20e represents the expected days of survival of a RU that has been deployed for 4 years. With respect to line 20a, the combined model uses the original nominal temperature Weibull (FIG. 6a) low confidence limit at a 95% proportion to set the "true" capacity of new cells. In the illustrated example, from FIG. 6a, using the 95% confidence low limit curve, 95% of the units will operate for 13 days across the temperature range from −10° C. to +60° C., and is represented in FIG. 7 by line segment 20a'. Likewise, in the illustrated example, from FIG. 6b, using the 95% confidence low limit curve, 95% of the new units, i.e., zero years of deployment, will operate for 7.25 days at −40° C. One of the unique features of the invention is the ability to predict performance curves for cold temperature deployments below the standard operating range, which in this case, is below −10° C. Line segment 20a" can be extrapolated between this data point and line 20a' to yield the overall predictive curve 18a and creating a predictive model between −40° C. and −10° C.

FIG. 7 is drawn using straight line approximations to the true shape, which can also be represented by other functions or with additional piece-wise linear segments. The straight line approximation form is the preferred representation when presenting the predictive model for use by operators and survey designers, who may not need or desire a more complex functional representation. Further, it may be necessary to take data for additional temperatures and rates in sub-steps 12a and 12c and extend the cell and statistical models to these additional temperatures in order to produce additional data to increase functional complexity for FIG. 7.

Those persons of ordinary skill in the art will appreciate from the foregoing disclosure that as RUs are deployed and redeployed, the predictive curves for days of employment will shift downward, as generally illustrated in FIG. 7. Thus, in FIG. 6, line 20e represents a 95% proportion of RUs at 95% confidence level, but after a unit has been deployed for 4 years. In this case, from FIG. 6a, using the 95% confidence low limit curve, 95% of the units will operate for 10.5-11 days when deployed in environments with average temperatures from −10° C. to 60° C., and is represented in FIG. 7 by line segment 20e'. Likewise, in the illustrated example, from FIG. 6b, using the 95% confidence low limit curve, 95% of units that have been deployed for 4 years will operate between 1.5 and 2 days at −40° C. Again, illustrative of a feature unique to the invention is the slope of the prediction curves for cold temperature deployments below −10 C. Specifically, line segment 20e" can be extrapolated between this data point and line 20e' to yield the overall predictive curve 20e and creating a predictive model between −40° C. and −10° C. for batteries that had been continuously deployed in Khartoum for four years.

A set of predictive charts such as FIG. 7 can be generated, using the method of this disclosure, for any make or model battery, in any proposed deployment scenario, given any prior history of the battery, and requiring any level of statistical confidence. The predictive power of this method is not limited to lithium-ion batteries, nor is it limited to seismic applications, though both were used throughout this discussion as a concrete example.

In the illustrated example of FIG. 7, the daily and seasonal temperatures (along with appropriate amount of radiation) of Khartoum, Sudan and Prudhoe Bay, Ak. were used as inputs to the cell model to project aging losses. The incremental capacity loss expected for each day's temperature, using the cell aging/cycling model as the output, may be calculated. The total loss over a period of time, such as after 1 to 4 years, may be calculated as the accumulated loss of all days in a year. Two losses may be calculated for each year, the room temperature capacity loss, and the cold capacity loss. The room temperature loss was assumed to apply to a standard operating temperature range that includes the standard operating temperature for the cell. In the case of the example, the standard operating temperature range is −10° C. to +60° C., and as before a desired operating temperature outside the standard range is selected (in the case of the example, −40° C.) and the cold capacity loss at that temperature was used to set a point from which a straight line can be assumed from there to the capacity loss at the standard operating temperature range. Then the projected percentage loss is used to reduce the number of days given in the line 20a. That sets the lines 20b, 20c, 20d and 20e.

FIG. 7 predicts the expected, worst case, days of survival for an RU deployment at any temperature, given a specific history of prior deployment in a location, such as Khartoum. In FIG. 67 utilizing the specific data of the example, for a brand new unit deployed at an average temperature of −20° C. we can use the green line to say we expect a minimum of 11 days. But for units that spent 2 years of continuous deployment in Khartoum, and then moved to the −20° C. location for a deployment we would expect only 9 days. And if we had a unit that had been used for 4 years in Khartoum, and moved to a −40 C location, only 1.5 days of survival is expected.

Any deployment scenario can be applied to the model, and a predictive chart similar to FIG. 7 can be generated in accordance with the method described above. Some RUs might be used for 6 months in Alaska, followed by 6 months in Khartoum, followed by 6 months storage at a third location. As long as an environmental model can be estimated for each location, the combined model can predict the percentage capacity loss.

It should be noted that in the seismic industry, it is very common for a seismic company to work a job in a location for months or years at a time, and then move the seismic equipment somewhere else in the world. A job consists of one or more deployments.

Thus, the illustration ran 4 years continuous use in Khartoum scenario as a bracketing case. The illustration also ran 4 years continuous in Prudhoe Bay, 6/6 months alternating locations, and a run of reduced cycles (not shown). Utilizing the invention as described, it is possible to run any scenario, real or artificial, based on models from the same plurality of cells, as long as the RU units were all built from the appropriate cell make/model.

Figure 8:
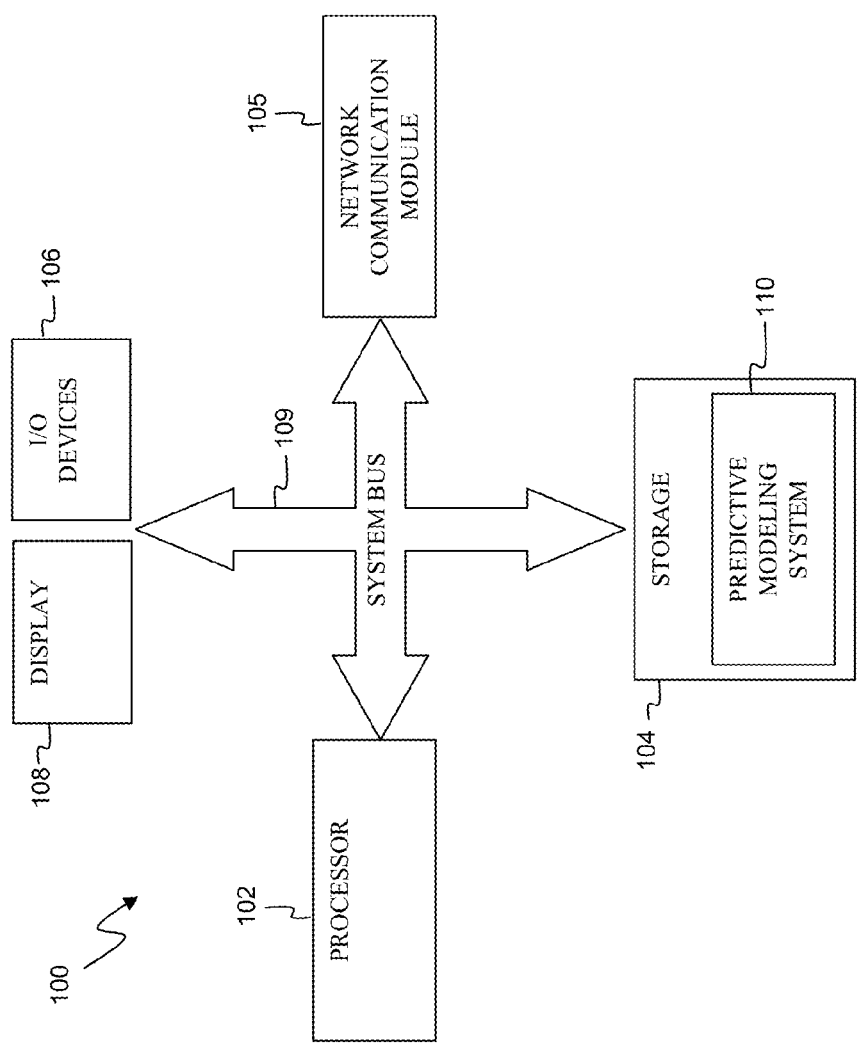
FIG. 8 is a block diagram of an exemplary computer system adapted for implementing the modeling system as described herein.

FIG. 8 is a block diagram of an exemplary computer system 100 adapted for implementing the modeling system as described herein. In certain embodiments, the computer system 100 may be integrated locally with an RU, while in other embodiments the computer system 100 may be external from an RU. In one embodiment, the computer system 100 includes at least one processor 102, a non-transitory, computer-readable storage 104, an optional network communication module 105, optional I/O devices 106, and an optional display 108, and all interconnected via a system bus 109. To the extent a network communications module 105 is included, the network communication module 105 is operable to communicatively couple the computer system 100 to other devices over a network. In one embodiment, the network communication module 105 is a network interface card (NIC) and communicates using the Ethernet protocol. In other embodiments, the network communication module 105 may be another type of communication interface such as a fiber optic interface and may communicate using a number of different communication protocols. It is recognized that the computer system 100 may be connected to one or more public (e.g. the Internet) and/or private networks (not shown) via the network communication module 105. Such networks may include, for example, servers upon which cell data, deployment data, weather data or other data needed for the modeling as described herein is stored. Software instructions executable by the processor 102 for implementing the predictive modeling system 110 in accordance with the embodiments described herein, may be stored in storage 104. It will also be recognized that the software instructions comprising the predictive modeling system 110 may be loaded into storage 104 from a CD-ROM or other appropriate storage media.

Referring back to FIG. 1, in certain embodiments, the results of the predictive model may be used to set battery control parameters in each seismic RU 1000. The predictive model may be stored on-board each RU 1000 or may be stored externally and utilized to verify an RU's capacity prior to re-deployment. With respect to predictive models stored on-board an RU 1000, typical battery control parameters include over- and under-temperature thresholds that determine if the battery circuitry is connected or disconnected to the main RU electronic circuitry depending on measured temperature. That is, the battery control circuit may cease to supply power to higher level functions of the RU 1000, such as GPS, clock, sensor, memory, etc., in order to prevent uncontrolled shut down, or in extreme cases, damage. These parameters are held in the memory of the battery control board, and may be set at the time of manufacture. These parameters can be defined from the results of the battery predictive model. In addition, battery control parameters for recovery from over- and under-temperature conditions are also stored in the RU memory. They are in general different from the thresholds and can also be determined by the predictive model.

In certain embodiments, it may be desirable to measure and record operation variables during deployment of the RU, such as the temperature, inside each RU or a subset of the RUs comprising a given system, for the purpose of confirming that the RUs are or were operated consistent with the model. This data may be recorded by on-board sensors and stored in a circuit with memory to retain the record in each RU.

With a specific history of the RU and the predictive model, one can predict current and future capacity loss as discussed above, as well as determine if the battery has been subjected to abuse, such as exposure to damaging temperatures. Such a record can be used to investigate problems with the RU in general, and problems with the battery in particular.

In certain embodiments, the predictive model may be used to define standards for Quality Assurance (QA) of batteries that are built into the RUs. A subset of the tests described above may be used to test incoming batteries on a lot-by-lot basis to determine if the batteries conform to the QA standards. The benefit is that RUs will be built with cells that perform the same as those that were used to create the predictive model. Importantly, the QA standards here differ from QA standards that the cell makers may use in their factory in that here the standards comprise at least one performance criteria that is beyond the cell specification. Accepted batteries are built into RUs with confidence that the RUs will perform according to the model. Rejected batteries may be discarded or qualified for use in less environmentally demanding products.

Those skilled in the art will appreciate that the invention takes advantage of extremely small discharge operating rates since seismic applications are orders of magnitude lower than cell maker's standard operating specifications. The invention identifies cell make/models that can be used at extremes well outside the standard operating specifications, such as for example, −40° C., which is no small push beyond a normal −20 C specified range. This is especially true given the fact that many cell models have capacity that does not just fade slowly with temperature below a particular lower standard operating range limit, such as −20° C., but many fall several orders of magnitude within the span of just 5 or 10° C. for a given discharge rate.

The invention allows for the selection of a particular make and model of cell for RU units in challenging usage scenarios. This is significant because many cells have similar specifications, and none address the special needs of seismic applications.

In certain embodiments, the invention results in the determination of values for unit parameters, such as over and under temperature thresholds and recovery parameters, which may then be set in the battery control electronics of the RU. The under temperature function in the battery software, for instance, will shut down the unit if the unit temperature falls below the under temperature parameter. No seismic data can be obtained in this condition. The function of recovery from under temperature will allow the unit to function again when the temperature increases. The under temperature parameter and recovery parameter are not necessarily the same. Without this invention, the parameters for under temperature and recovery should be set at the lower limit of the normal specification of a cell, such as −20° C. in the illustrative case. If, through results of the predictive model, it is discovered that a make and model of a cell will perform appropriately when used at a temperature much lower than the standard operating temperature lower limit, such as −40° C. for instance, the under temperature parameter may be set at −40° C. Once these parameters are determined for a certain cell make and model, all seismic units built using those cells can have the same parameters. If a new seismic requirement arises, for instance the requirement to work at −45° C., a new round of testing per this invention can be performed to determine a suitable make and model, before units can be built and the −45° C. value for the under temperature parameter can be entered.

In order for the projected capacity to be realized after months or years of use it is desirable that seismic units are used consistent with the environmental models developed for the units. If, for example, units are stored for 6 months in a desert warehouse constantly subjected to solar radiation the capacity of the batteries can decay faster than the model predicts. To know what environment a unit has been subjected to through its history, in certain embodiments, it may be desired to include a monitoring board with sensors with an RU. The data may be used to investigate problems of low capacity, in addition to other unit problems, for the purposes of continuous improvement.

Once a cell make/model has been selected for use in product builds, RUs are manufactured utilizing the cells, which manufacturing may include the programming of the battery control electronics utilizing the predictive model, and the RUs are deployed into the field.

In another embodiment of the invention, the RU and/or a computer system monitoring or controlling a system of RUs may include a global positioning system (e.g. "GPS" or other position technologies) for use as a time reference in the RU and/or to determine the location of the RU. Likewise, the RU and/or a computer system monitoring or controlling a system of RUs may include a communications module to externally access weather data from an external source, such as the world wide web or an external server on which weather data is stored. GPS location and/or timing data may be tracked and stored as historical data to identify the locations and time periods where an RU has been deployed, charge/discharge cycled, and/or stored, thereby permitting one or more of the foregoing models of the invention to be updated. Likewise, utilizing the current location of the RU (acquired by GPS or other means) and/or a computer system monitoring or controlling a system of RUs, the weather data for the deployment location can be accessed and utilized to create and/or update the environmental model of step 16, and provide a prediction of available deployment life based on the current location of the RU and/or a computer system monitoring or controlling a system of RUs.

In a further embodiment, confidence band width and deployment life statistics may be made adjustable parameters to be stored and utilized to create and/or update the statistical model of step 18. Segmentation ratio, a parameter that describes the duty cycle of the RUs during deployment, and derating factor, a parameter used to build in a margin of safety on the capacity of batteries, may also be made adjustable and stored and utilized to create and/or update the cell model of step 14. These factors, along with location, cycle, time and weather mentioned above may be adjusted manually. Manual adjustment may be done during deployment or outside the deployment time period, for instance by operators in a "dog house" or by exploration survey planners in a main office. Adjustments and updates to the model may be processed by a battery behavior algorithm or computer program contained in a computer, RU, or handheld electronic device, with the result that the program and computer may be considered a planning and operation tool with input described above, and created or updated predictive battery behavior as the output.

In certain embodiments, the predictive model can serve a Quality Control (QC) function. One non-limiting example is when a system of RUs comprises units of varying deployment history (for instance, if RUs with three years of use are mixed with newer RUs with, say, 6 months of use). Nominal capacity predictions of the old and new units may be very similar, however, capacity at −40° C. may be predicted to be very different between the two groups. In that case deploying the mixed system could result in data loss due to older RUs becoming depleted before the newer ones and missing shots. The QC function can prevent deployment of mixed systems, as in this example, or it can be used to prevent deployment of any individual RU whose capacity is insufficient for the deployment scenario, in the general case. The QC function may also be utilized during run time to indicate RUs that are predicted to have insufficient capacity to survive to the end of the deployment period, due to changes in the deployment scenario that were unforeseen at the time of survey planning or deployment. In certain embodiments, this QC function may be integrated locally with an RU, while in other embodiments it may be implemented external to the RU. Thus, the foregoing invention allows the determination or prediction of the permanent capacity loss of the cell of an RU based on the particular history, or anticipated future deployment, of the RU in which the cell is used.

Although the examples above have been provided with reference to a seismic RU, it is to be understood the above described techniques maybe be applied to other types devices in a variety of contexts. For example, in some embodiments, information related to the performance of a battery may be determined. Any suitable measure of battery performance may be determined including, for example, battery capacity, available battery usage lifetime, battery charge cycling information, battery thermal cycling information, battery rapid aging information, battery thermal performance information, battery charge rate; battery discharge rate, battery charge capacity, battery discharge capacity, battery state of charge monitor information, battery state of health monitor information, battery energy, battery internal impedance, battery AC impedance, or battery Rangone curve information.

Environmental condition information can be received, obtained or otherwise generated that is indicative of environmental conditions (e.g., average temperature, peak temperature, temperature cycling information etc.) of the device during a usage period. In some embodiments, environmental condition information may be determined using at least one sensor (e.g., a temperature sensor that measures the temperature of the device during the usage period). In some embodiments, the sensor is included in the device. In other cases the sensor may be external to the device.

Some embodiments include determining at least a portion of the environmental condition information by accessing a data source located remotely from the device, e.g., a weather data source. For example, the device may include a wireless data link that can be used to access an online weather database to determine environmental conditions reported at or near the location of the device (e.g., using device position information as described below).

One may further determine operating parameter information indicative of one or more operating parameters of the battery during the usage period. This information, in possible combination with the environmental information may be combined with a performance model of the battery to determine battery performance information.

In various embodiments, any battery operating parameters may be used. The parameters may be dynamic parameters (e.g., the charge state of the battery at a given time) or static parameters (e.g., a set battery overcharge threshold). In some embodiments these parameters may be measured using a sensor, or may simply be input based on known information about the battery and/or its intended use in the device.

In some embodiments, the operating parameter may be a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, a battery over-current protection threshold, or combinations thereof.

In some embodiments, the performance model is based at least in part on experimental battery performance data for a battery type corresponding to the battery (e.g., using the statistical techniques described above). In some embodiments, the performance model is based at least in part on performance data for a plurality of sample devices corresponding to the device.

In some embodiments, location information indicative of a spatial and/or temporal location of the battery during the usage period can be received, obtained, or generated. The location information may come from an internal unit of the device (e.g. a clock and/or global positioning unit), or may be generated externally. As noted above, this location information may be used to determine the environmental condition information, e.g., using an environmental model (such as a weather forecast that provides daily temperature information at the device location) indicative of the environmental conditions at the location during the usage period, or by accessing a data source located remotely from the device. In some embodiments, the data source includes a weather data source. In some embodiments, this environmental information may be used to confirm or supplement environmental information directly detected using a sensor.

Some embodiments include controlling the operation of the device based at least in part on the battery performance information. For example, certain components of the device may be switched on or off, or placed in a low power mode if a low battery capacity condition is determined.

In some embodiments, operating parameter of the battery may be controlled, e.g., by programming the battery control electronics. In various embodiments, the control can be one time (e.g., prior to deployment of the device), occasional, periodic, or continuous.

Some embodiments include outputting the battery performance information. For example, if the battery performance information is related to battery capacity, this information may be output to a battery capacity indicator, gauge, or display (e.g., as shown in the example below with reference to FIGS. 9a and 9b.)

As detailed above (e.g. in reference to FIG. 1), in some embodiments, the device includes a seismic data acquisition unit. In some embodiments, seismic data acquisition unit includes one ore more seismic vibration sensors (e.g., geophones), a clock, a memory for storing data from the sensor; the battery; and control electronics (e.g., including battery control electronics). As detailed above, in some embodiments, the battery performance information may be used in a backward looking fashion, e.g., to determine if the seismic data acquisition unit satisfies a criterion for future usage based on its past usage history. In other embodiments, the battery performance information is determined "on the fly" during the usage period, e.g., using environmental and location information determined by on-board sensors, and feeding that information to an on board processor for use with a battery performance model that is stored in on board memory.

As will be apparent to one skilled in the art, the techniques described herein may be used in a multitude of applications for determining battery performance information in various kinds of devices. For example, the device may be mobile computer (e.g., a laptop or tablet device), mobile phone, or other mobile battery powered device (e.g., a mobile medical device such as a mobile defibrillator or heart monitor).

Figure 9B:
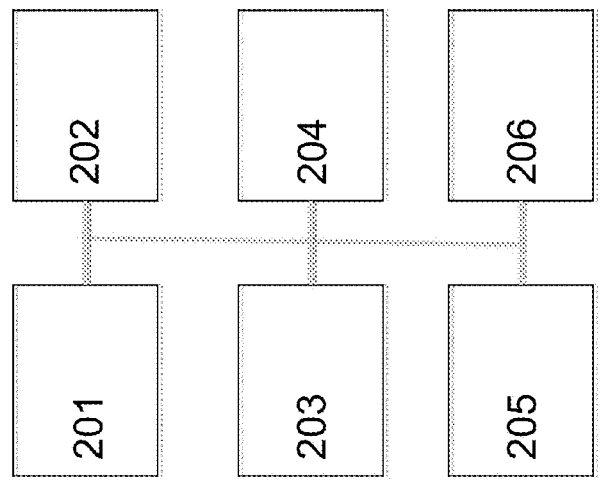
Figure 9A:
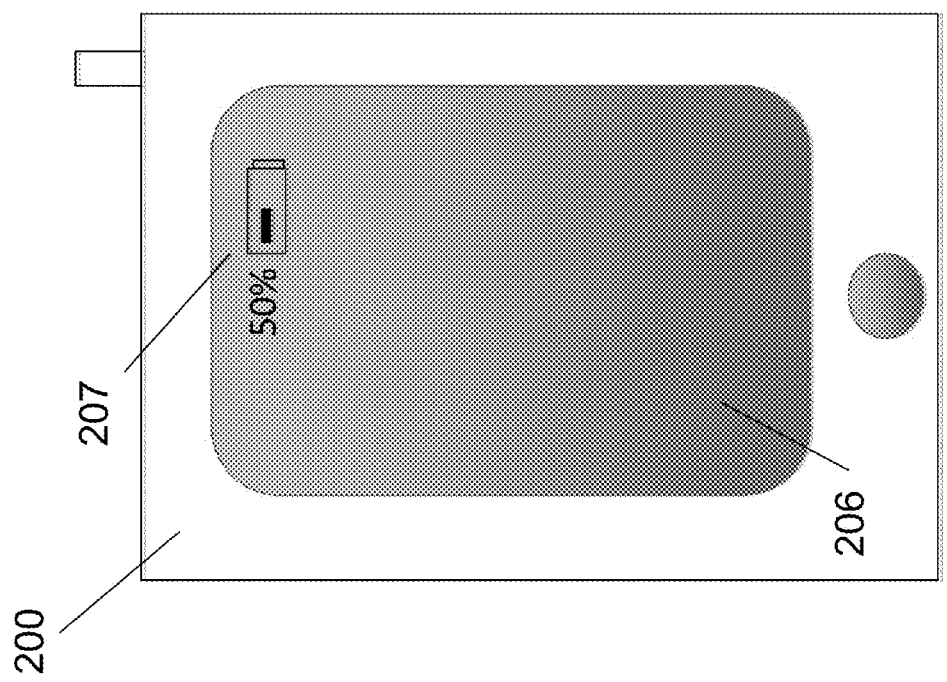
FIG. 9a is an illustration of a mobile phone.

For example, FIG. 9a shows a mobile smart phone 200. FIG. 9b shows a functional block diagram of the smart phone 200. The phone includes a battery 201, a processor 202, a memory 203, a wireless transceiver 204, a GPS unit 205, and a display 206. The memory 203 may include a battery performance model for the battery 201. The GPS unit 205 may determine the spatial and temporal location of the phone 200, and pass that information to the processor 202. Using the wireless transceiver 204, the processor may access a remote data source (e.g. a weather data source) and, using the location information, obtain environmental information about the phone 200 (e.g., the ambient temperature at the phone's location). Alternatively, the phone 200 may include a sensor, such as a temperature sensor (not shown) that directly measures environmental information.

The processor 202, in possible combination with the memory 203 and one or more sensors (not shown), may also monitor one or more operating parameters of the battery 201 (e.g., discharge rate or cycling history). The processor 202 may use the environmental information and/or information about the operating parameters, along with the stored battery performance model, to determine performance information for the battery 201. For example, the processor 202 can determine information about the battery capacity that is informed by the environmental and usage history of the battery 201. This information can then be output, e.g., as shown, to provide a more accurate battery capacity meter 207 on the display 206 of the phone 200. The information could also be used to control other functions of the phone 200, e.g., to switch of the GPS unit 205 when a low battery capacity condition is determined. Note in some embodiments, some or all of the on-board processing steps and memory storage described above may take place remotely.

In other embodiments the device may be a vehicle (e.g., an automotive, marine, or air vehicle), a vehicle component, a power supply (e.g., a battery used in a hybrid power supply such as a fuel cell supply, a mobile power supply for a recreational vehicle, etc.), or any other suitable device that includes a battery. In general, the techniques used herein are particularly advantageous for devices used in harsh environments where extreme conditions may significantly impact battery performance.

In various embodiments, the techniques described herein may generally be used for qualifying a battery cell type for use in a device (e.g., a seismic recording unit RU) to be deployed at a selected spatial and temporal location. One may generate an environmental model predictive of one or more environmental condition of the seismic device at the selected spatial and temporal location; generate a device performance model predictive of one or more operating parameters of the device at the selected spatial and temporal location and generating a battery performance model predictive of the performance of the battery cell type in the unit as a function of the environmental condition and operating parameter of the seismic unit. These models may be used to predict the performance (e.g. capacity and/or durability) of the battery cell type. The predicted performance can be compared to a performance standard to qualifying the battery cell type.

As described above with reference to seismic applications, this qualification technique can be particularly advantageously applied in application where the battery cell is used at discharge rates significantly below the nominal or maximum discharge rate of the battery cell type. For example, in some embodiments, one predicts the performance of the battery cell type at an operational discharge rate less than the cell type's nominal discharge rate, e.g., less than about 1%, about 0.1%, 0.01%, about 0.001% or less of the nominal discharge rate. In some embodiments, one predicts the performance of the battery cell type at an operational discharge rate less than the cell type's maximum discharge rate, e.g., less than about 1%, about 0.1%, 0.01%, about 0.001% or less of the maximum discharge rate.

For example, in some embodiments, the nominal discharge rate is greater than about 1 A, and the operational discharge rate is less than about 10 mA. The nominal discharge rate may be the range of 0.5-100 A, and the operational discharge rate in the range of 0.05-50 mA.

In some embodiments, the maximum discharge rate is greater than about 1 A, and the operational discharge rate is less than about 10 mA. The maximum discharge rate may be in the range of 0.5-100 A, and the operational discharge rate in the range of 0.05-50 mA.

In various embodiments, the prediction may be for performance at a selected temperature or temperature range, e.g., less than 0° C., −10° C., −20° C., −30° C., −40° C., −50° C., or in the range of 0 to −100° C. or any subrange thereof.

It is to be understood that it some embodiments, a similar approach may be used to qualify cells for use at high temperatures e.g., temperatures above 25° C., 30° C., 40° C., 50° C. or more. Similarly these techniques may be adapted for qualifying cells that are subject to large temperature cycles, e.g., where the maximum to minimum temperature swing is at least 20° C., 30° C., 40° C., 50° C. or more.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of controlling a seismic data acquisition unit based on battery performance information, comprising:
    receiving, by one or more processors of the seismic data acquisition unit, environmental condition information indicative of environmental conditions of the seismic data acquisition unit during a usage period;
    receiving, by the one or more processors, operating parameter information indicative of one or more operating parameters of a battery powering the seismic data acquisition unit during the usage period, the operating parameter information determined based on the battery performance information that corresponds to a battery performance model developed for the battery powering the seismic data acquisition unit;
    comparing, by the one or more processors, the environmental condition information to the operating parameter information to determine to disable acquisition of seismic data; and
    controlling, by the one or more processors, based on the comparing the environmental condition information to the operating parameter information, a component of the seismic data acquisition unit to disable acquisition of seismic data.

2. The method of claim 1, further comprising:
    receiving location information indicative of a spatial and temporal location of the battery during the usage period;
    generating the environmental condition information based at least in part on the location information and an environmental model indicative of the environmental conditions at the location during the usage period.

3. The method of claim 2, wherein the environmental model comprises a weather model.

4. The method of claim 3, wherein the weather model provides information indicative of the daily temperature at the location during the usage period.

5. The method of claim 2, comprising acquiring at least a portion of the location information using a global positioning unit.

6. The method claim 2, comprising acquiring at least a portion of the location information using a clock included in the seismic data acquisition unit.

7. The method of claim 1, further comprising:
    determining at least a portion of the environmental condition information using at least one sensor.

8. The method of claim 7, wherein the sensor is included in the seismic data acquisition unit.

9. The method of claim 8, wherein the sensor comprises a temperature sensor, and
    wherein determining at least a portion of the environmental condition information using a sensor comprises determining information indicative of the temperature of the battery during the usage period.

10. The method of claim 1, further comprising:
    determining at least a portion of the environmental condition by accessing a data source located remotely from the seismic data acquisition unit.

11. The method of claim 10, wherein the data source comprises a weather data source.

12. The method of claim 1, comprising controlling the operation of the seismic data acquisition unit based at least in part on the battery performance information.

13. The method of claim 12, wherein controlling the operation of the seismic data acquisition unit based at least in part on the battery performance information comprises controlling at least one operating parameter of the battery.

14. The method of claim 1 further comprising outputting the battery performance information.

15. The method of claim 1, wherein the seismic data acquisition unit comprises:
    at least one seismic vibration sensor,
    a clock,
    a memory configured to store data from the at least one seismic vibration sensor;
    the battery; and
    battery control electronics, and
    the method further comprises programming the battery control electronics based at least in part on the battery performance information.

16. The method of claim 1, wherein the seismic data acquisition unit comprises a seismic node.

17. The method of claim 1, further comprising:
    determining that the seismic data acquisition unit satisfies a criterion for future usage based at least in part on the battery performance information.

18. The method of claim 1, wherein the battery performance model is based at least in part on experimental battery performance data for a battery type corresponding to the battery.

19. The method of claim 1, wherein the battery performance model is based at least in part on performance data for a plurality of sample devices corresponding to the seismic data acquisition unit.

20. The method of claim 1, wherein the battery performance information comprises at least one selected from the list consisting of: battery capacity, available battery usage lifetime, battery charge cycling information, battery thermal cycling information, battery rapid aging information, battery thermal performance information, battery charge rate, battery discharge rate, battery charge capacity, battery discharge capacity, battery state of charge monitor information, battery state of health monitor information, battery energy, battery internal impedance, battery AC impedance, and battery Rangone curve information.

21. The method of claim 1, wherein the one or more operating parameters comprises at least one from the list consisting of: a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, and a battery over-current protection threshold.

22. The method of claim 21, further comprising determining operating parameter information using a sensor included in the seismic data acquisition unit.

23. The method of claim 1, comprising:

positioning the seismic data acquisition unit on one of terrain above ground or an ocean bottom.

24. A system to control a seismic data acquisition unit based on battery performance information, comprising:
the seismic data acquisition unit comprising one or more memory storage devices and one or more processors operatively connected to the one or more memory storage devices configured to:
receive environmental condition information indicative of environmental conditions of the seismic data acquisition unit during a usage period;
receive operating parameter information indicative of one or more operating parameters of a battery configured to power the seismic data acquisition unit during the usage period, the operating parameter information determined based on the battery performance information that corresponds to a battery performance model developed for the battery powering the seismic data acquisition unit;
compare the environmental condition information to the operating parameter information to determine to disable acquisition of seismic data; and
control, based on the environmental condition information compared with the operating parameter information, a component of the seismic data acquisition unit to disable acquisition of seismic data.

25. The system of claim 24, wherein the processor is configured to:
receive location information indicative of a spatial and temporal location of the battery during the usage period;
generate the environmental condition information based at least in part on the location information and an environmental model indicative of the environmental conditions at the location during the usage period.

26. The system of claim 25, wherein the environmental model comprises a weather model.

27. The system of claim 26, wherein the weather model provides information indicative of the daily temperature at the location during the usage period.

28. The system of claim 25, wherein the environmental model is stored on at least one of the one or more memory storage devices.

29. The system of claim 25, comprising a global positioning unit operatively connected to the processor and configured to acquire at least a portion of the location information.

30. The system of claim 29, wherein the global positioning unit is included in the seismic data acquisition unit.

31. The system of claim 25, further comprising a clock included in the seismic data acquisition unit, the clock configured to acquire at least a portion of the temporal location information.

32. The system of claim 24, further comprising a sensor configured to determine at least a portion of the environmental condition information using a sensor.

33. The system of claim 32, wherein the sensor is included in the seismic data acquisition unit.

34. The system of claim 33, wherein:
the sensor comprises a temperature sensor configured to determining information indicative of the temperature of the battery during the usage period.

35. The system of claim 24, further comprising at least one communication unit operatively connected to the processor, and wherein the processor is configured to determine at least a portion of the environmental condition by accessing a data source located remotely from the seismic data acquisition unit.

36. The system of claim 35, wherein the data source comprises a weather data source.

37. The system of claim 24, comprising a control unit included in the unit and configured to:
receive battery performance information; and
control the operation of the seismic data acquisition unit based at least in part on the battery performance information.

38. The system of claim 37, wherein the control unit is configured to control an operating parameter of the battery based at least in part on the battery performance information.

39. The system of claim 24, further comprising an output unit configured to output the battery performance information.

40. The system of claim 24, wherein the seismic data acquisition unit is a seismic node.

41. The system of claim 24, wherein the seismic data acquisition unit comprises:
at least one seismic vibration sensor,
a clock,
a memory configured to store data from the at least one seismic vibration sensor;
the battery; and
battery control electronics, and
wherein the battery control electronics are programmed based at least in part on the battery performance information.

42. The system of claim 24, wherein the processor is configured to determine that the seismic data acquisition unit is fit for a future usage based at least in part on the battery performance information.

43. The system of claim 24, wherein the battery performance model is based at least in part on experimental battery performance data for a battery type corresponding to the battery.

44. The system of claim 24, wherein the battery performance model is based at least in part on performance data for a plurality of sample devices corresponding to the seismic data acquisition unit.

45. The system of claim 24, wherein the battery performance information comprises at least one selected from the list consisting of: battery capacity, available battery usage lifetime, battery charge cycling information, battery thermal cycling information, battery rapid aging information, battery thermal performance information, battery charge rate, battery discharge rate, battery charge capacity, battery discharge capacity, battery state of charge monitor information, battery state of health monitor information, battery energy, battery internal impedance, AC impedance, and battery Rangone curve information.

46. The system of claim 24, wherein the one or more operating parameters comprises at least one from the list consisting of: a battery discharge rate, a battery charge rate, a battery discharge capacity, a battery charge capacity, a battery state of charge, a battery thermal protection threshold, a battery thermal recovery threshold, a battery thermal disable threshold, a battery over charge threshold, a battery over-discharge threshold, and a battery over-current protection threshold.

47. The system of claim 24, further comprising at least one sensor included in the device configured to determine at least a portion of the operating parameter information.

48. The system of claim 24, wherein the seismic data acquisition unit is positioned on one of terrain above ground or an ocean bottom.

49. A method of controlling a seismic data acquisition unit based on a usage lifetime, comprising:

receiving, by one or more processors of the seismic data acquisition unit, an environmental model predictive of one or more environmental condition of the seismic data acquisition unit at a selected spatial and temporal location;

receiving, by the one or more processors, a seismic data acquisition unit performance model predictive of one or more operating parameter of the data acquisition unit;

receiving, by the one or more processors, a battery performance model predictive of the performance of a battery used to power the seismic data acquisition unit as a function of the environmental condition and operating parameter of the seismic unit;

using the battery performance model to determine the usage lifetime of the seismic data acquisition unit at a selected spatial and temporal location based on the environmental model and the seismic data acquisition unit performance model; and controlling, by the one or more processors, operation of the seismic data acquisition unit based on the usage lifetime at the selected spatial and temporal location determined using the battery performance model.

* * * * *